United States Patent
O'Brien et al.

(10) Patent No.: US 11,456,883 B2
(45) Date of Patent: *Sep. 27, 2022

(54) MULTIPLE PHASE PULSE POWER IN A NETWORK COMMUNICATIONS SYSTEM

(71) Applicant: CISCO TECHNOLOGY, INC., San Jose, CA (US)

(72) Inventors: Richard Anthony O'Brien, Livermore, CA (US); Douglas Paul Arduini, San Ramon, CA (US); Sung Kee Baek, San Ramon, CA (US); Ruqi Li, Fremont, CA (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 69 days.

This patent is subject to a terminal disclaimer.

(21) Appl. No.: 16/380,954

(22) Filed: Apr. 10, 2019

(65) Prior Publication Data

US 2020/0295955 A1    Sep. 17, 2020

Related U.S. Application Data

(60) Provisional application No. 62/817,813, filed on Mar. 13, 2019.

(51) Int. Cl.
*G01R 31/50* (2020.01)
*H04L 12/10* (2006.01)
(Continued)

(52) U.S. Cl.
CPC ............ *H04L 12/10* (2013.01); *G01R 31/085* (2013.01); *H04L 41/0677* (2013.01)

(58) Field of Classification Search
CPC .... G01R 31/085; H04L 12/10; H04L 41/0677
See application file for complete search history.

(56) References Cited

U.S. PATENT DOCUMENTS 3,335,324 A    8/1967    Buckeridge
3,962,529 A    6/1976    Kubo
(Continued)

FOREIGN PATENT DOCUMENTS

CN    DN1209880 C    7/2005
CN    201689347 U    12/2010
(Continued)

OTHER PUBLICATIONS

"Network Remote Power Using Packet Energy Transfer", Eaves et al., www.voltserver.com, Sep. 2012.
(Continued)

*Primary Examiner* — Albert Wang

(57) ABSTRACT

In one embodiment, an apparatus comprises an input power interface for receiving input power, a power control system for transmitting DC (Direct Current) pulse power on multiple phases over a cable to a plurality of powered devices and verifying cable operation during an off-time of pulses in the DC pulse power, and a cable interface for delivery of the DC pulse power on the multiple phases and data over the cable to the powered devices. A method for transmitting multiple phase pulse power is also disclosed herein.

32 Claims, 15 Drawing Sheets

(51) Int. Cl.
*G01R 31/08* (2020.01)
*H04L 41/0677* (2022.01)

(56) References Cited

U.S. PATENT DOCUMENTS

| | | |
|---|---|---|
| 4,811,187 A | 3/1989 | Nakajima |
| 4,997,388 A | 3/1991 | Dale |
| 6,220,955 B1 | 4/2001 | Posa |
| 6,259,745 B1 | 7/2001 | Chan |
| 6,685,364 B1 | 2/2004 | Brezina |
| 6,784,790 B1 | 8/2004 | Lester |
| 6,826,368 B1 | 11/2004 | Koren |
| 6,855,881 B2 | 2/2005 | Khoshnood |
| 7,325,150 B2 | 1/2008 | Lehr |
| 7,420,355 B2 | 9/2008 | Liu |
| 7,566,987 B2 | 7/2009 | Black et al. |
| 7,583,703 B2 | 9/2009 | Bowser |
| 7,589,435 B2 | 9/2009 | Metsker |
| 7,593,747 B1 | 9/2009 | Karam |
| 7,616,465 B1 | 11/2009 | Vinciarelli |
| 7,813,646 B2 | 10/2010 | Furey |
| 7,835,389 B2 | 11/2010 | Yu |
| 7,915,761 B1 | 3/2011 | Jones |
| 7,921,307 B2 | 4/2011 | Karam |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,184,525 B2 | 5/2012 | Karam |
| 8,276,397 B1 | 10/2012 | Carlson |
| 8,310,089 B2 | 11/2012 | Schindler |
| 8,345,439 B1 | 1/2013 | Goergen |
| 8,350,538 B2 | 1/2013 | Cuk |
| 8,358,893 B1 | 1/2013 | Sanderson |
| 8,386,820 B2 | 2/2013 | Diab |
| 8,638,008 B2 | 1/2014 | Baldwin et al. |
| 8,700,923 B2 | 4/2014 | Fung |
| 8,768,528 B2 | 7/2014 | Millar et al. |
| 8,781,637 B2 | 7/2014 | Eaves |
| 8,829,917 B1 | 9/2014 | Lo |
| 8,836,228 B2 | 9/2014 | Xu |
| 8,842,430 B2 | 9/2014 | Hellriegel |
| 9,024,473 B2 | 5/2015 | Huff |
| 9,184,795 B2 | 11/2015 | Eaves |
| 9,189,043 B2 | 11/2015 | Vorenkamp |
| 9,273,906 B2 | 3/2016 | Goth |
| 9,319,101 B2 | 4/2016 | Lontka |
| 9,373,963 B2 | 6/2016 | Kuznetsov |
| 9,419,436 B2 | 8/2016 | Eaves |
| 9,484,771 B2 | 11/2016 | Braylovskiy |
| 9,510,479 B2 | 11/2016 | Vos |
| 9,531,551 B2 | 12/2016 | Balasubramanian |
| 9,590,811 B2 | 3/2017 | Hunter, Jr. |
| 9,640,998 B2 | 5/2017 | Dawson |
| 9,665,148 B2 | 5/2017 | Hamdi |
| 9,693,244 B2 | 6/2017 | Maruhashi |
| 9,734,940 B1 | 8/2017 | McNutt |
| 9,853,689 B2 | 12/2017 | Eaves |
| 9,874,930 B2 | 1/2018 | Vavilala |
| 9,882,656 B2 | 1/2018 | Sipes |
| 9,893,521 B2 | 2/2018 | Lowe |
| 9,948,198 B2 | 4/2018 | Imai |
| 10,007,628 B2 | 6/2018 | Pitigoi-Aron |
| 10,028,417 B2 | 7/2018 | Schmidtke |
| 10,263,526 B2 | 4/2019 | Sandusky et al. |
| 10,281,513 B1 | 5/2019 | Goergen |
| 10,407,995 B2 | 9/2019 | Moeny |
| 10,541,543 B2 | 1/2020 | Eaves |
| 10,541,758 B2 | 1/2020 | Goergen |
| 10,631,443 B2 | 4/2020 | Byers |
| 10,735,105 B2 | 8/2020 | Goergen et al. |
| 2002/0126967 A1 | 9/2002 | Panak |
| 2004/0000816 A1 | 1/2004 | Khoshnood |
| 2004/0033076 A1 | 2/2004 | Song |
| 2004/0043651 A1 | 3/2004 | Bain |
| 2004/0073703 A1 | 4/2004 | Boucher |
| 2004/0264214 A1 | 12/2004 | Xu |
| 2005/0197018 A1 | 9/2005 | Lord |
| 2005/0268120 A1 | 12/2005 | Schindler |
| 2006/0202109 A1 | 9/2006 | Delcher |
| 2007/0103168 A1 | 5/2007 | Batten |
| 2007/0143508 A1 | 6/2007 | Linnman |
| 2007/0288125 A1 | 12/2007 | Quaratiello |
| 2008/0054720 A1 | 3/2008 | Lum |
| 2008/0198635 A1 | 8/2008 | Hussain |
| 2008/0229120 A1 | 9/2008 | Diab |
| 2008/0310067 A1 | 12/2008 | Diab |
| 2009/0027033 A1 | 1/2009 | Diab |
| 2010/0077239 A1 | 3/2010 | Diab |
| 2010/0117808 A1 | 5/2010 | Karam |
| 2010/0171602 A1 | 7/2010 | Kabbara |
| 2010/0190384 A1 | 7/2010 | Lanni |
| 2010/0290190 A1 | 11/2010 | Chester |
| 2011/0007664 A1 | 1/2011 | Diab |
| 2011/0290497 A1 | 1/2011 | Stenevik |
| 2011/0057612 A1 | 3/2011 | Taguchi |
| 2011/0083824 A1 | 4/2011 | Rogers |
| 2011/0266867 A1 | 11/2011 | Schindler |
| 2012/0043935 A1 | 2/2012 | Dyer |
| 2012/0064745 A1 | 3/2012 | Ottliczky |
| 2012/0170927 A1 | 7/2012 | Huang |
| 2012/0201089 A1 | 8/2012 | Barth |
| 2012/0231654 A1 | 9/2012 | Conrad |
| 2012/0287984 A1 | 11/2012 | Lee |
| 2012/0317426 A1 | 12/2012 | Hunter, Jr. |
| 2012/0319468 A1 | 12/2012 | Schneider |
| 2013/0077923 A1 | 3/2013 | Peeters Weem |
| 2013/0079633 A1 | 3/2013 | Weem |
| 2013/0103220 A1 | 4/2013 | Eaves |
| 2013/0249292 A1 | 9/2013 | Blackwell, Jr |
| 2013/0272721 A1 | 10/2013 | Van Veen |
| 2013/0329344 A1 | 12/2013 | Tucker |
| 2014/0126151 A1 | 5/2014 | Campbell |
| 2014/0258742 A1 | 9/2014 | Chien |
| 2014/0258813 A1 | 9/2014 | Lusted |
| 2015/0078740 A1 | 3/2015 | Sipes, Jr |
| 2015/0106539 A1 | 4/2015 | Leinonen |
| 2015/0115741 A1 | 4/2015 | Dawson |
| 2015/0207317 A1 | 7/2015 | Rademacher |
| 2015/0215001 A1 | 7/2015 | Eaves |
| 2015/0333918 A1 | 11/2015 | White, III |
| 2016/0018252 A1 | 1/2016 | Hanson |
| 2016/0020911 A1 | 1/2016 | Sipes, Jr |
| 2016/0064938 A1 | 3/2016 | Balasubramanian |
| 2016/0111877 A1 | 4/2016 | Eaves |
| 2016/0134331 A1 | 5/2016 | Eaves |
| 2016/0142217 A1 | 5/2016 | Gardner |
| 2016/0188427 A1 | 6/2016 | Chandrashekar |
| 2016/0197600 A1 | 7/2016 | Kuznetsov |
| 2016/0365967 A1 | 7/2016 | Tu |
| 2016/0241148 A1 | 8/2016 | Kizilyalli |
| 2016/0262288 A1 | 9/2016 | Chainer |
| 2016/0294500 A1 | 10/2016 | Chawgo |
| 2016/0294568 A1 | 10/2016 | Chawgo et al. |
| 2016/0308683 A1 | 10/2016 | Pischl |
| 2016/0352535 A1 | 12/2016 | Hiscock |
| 2017/0054296 A1 | 2/2017 | Daniel |
| 2017/0110871 A1 | 4/2017 | Foster |
| 2017/0146260 A1 | 5/2017 | Ribbich |
| 2017/0155517 A1 | 6/2017 | Cao |
| 2017/0164525 A1 | 6/2017 | Chapel |
| 2017/0155518 A1 | 7/2017 | Yang |
| 2017/0214236 A1 | 7/2017 | Eaves |
| 2017/0229886 A1 | 8/2017 | Eaves |
| 2017/0234738 A1 | 8/2017 | Ross |
| 2017/0248976 A1 | 8/2017 | Moller |
| 2017/0294966 A1 | 10/2017 | Jia |
| 2017/0325320 A1 | 11/2017 | Wendt |
| 2018/0024964 A1 | 1/2018 | Mao |
| 2018/0060269 A1 | 3/2018 | Kessler |
| 2018/0088648 A1 | 3/2018 | Otani |
| 2018/0098201 A1 | 4/2018 | Torello |
| 2018/0102604 A1 | 4/2018 | Keith |

(56) References Cited

U.S. PATENT DOCUMENTS

| | | |
|---|---|---|
| 2018/0123360 A1 | 5/2018 | Eaves |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec |
| 2018/0340840 A1 | 11/2018 | Bullock |
| 2019/0126764 A1 | 5/2019 | Fuhrer |
| 2019/0272011 A1 | 9/2019 | Goergen |
| 2019/0277899 A1 | 9/2019 | Goergen |
| 2019/0277900 A1 | 9/2019 | Goergen |
| 2019/0278347 A1 | 9/2019 | Goergen |
| 2019/0280895 A1 | 9/2019 | Mather et al. |
| 2019/0304630 A1 | 10/2019 | Goergen |
| 2019/0312751 A1 | 10/2019 | Goergen |
| 2019/0342011 A1 | 10/2019 | Goergen |
| 2019/0363493 A1 | 11/2019 | Sironi |
| 2020/0044751 A1 | 2/2020 | Goergen |
| 2020/0228001 A1* | 7/2020 | Lambert ........... H02J 13/00002 |

FOREIGN PATENT DOCUMENTS

| | | |
|---|---|---|
| CN | 204836199 U | 12/2015 |
| CN | 205544597 | 8/2016 |
| CN | 104081237 B | 10/2016 |
| CN | 104412541 B | 5/2019 |
| EP | 1936861 A1 | 6/2008 |
| EP | 2120443 A1 | 11/2009 |
| EP | 2257009 A2 | 1/2010 |
| EP | 2432134 A1 | 3/2012 |
| EP | 2693688 A1 | 2/2014 |
| WO | WO199316407 A1 | 8/1993 |
| WO | WO2006127916 A2 | 11/2006 |
| WO | WO2010053542 | 5/2010 |
| WO | WO2017054030 | 4/2017 |
| WO | WO2017167926 A1 | 10/2017 |
| WO | 2018017544 A1 | 1/2018 |
| WO | WO2019023731 A1 | 2/2019 |
| WO | WO2019212759 A1 | 11/2019 |

OTHER PUBLICATIONS https://www.fischerconnectors.com/us/en/products/fiberoptic.
http://www.strantech.com/products/tfoca-genx-hybrid-2x2-fiber-optic-copper-connector/.
http://www.qpcfiber.com/product/connectors/e-link-hybrid-connector/.
https://www.lumentum.com/sites/default/files/technical-library-items/poweroverfiber-tn-pv-ae_0.pdf.
Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.
Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.
Yencheck, Thermal Modeling of Portable Power Cables, 1993.
Zhang, Machine Learning-Based Temperature Prediction for Runtime Thermal Management across System Components, Mar. 2016.
Data Center Power Equipment Thermal Guidelines and Best Practices.
Dynamic Thermal Rating of Substation Terminal Equipment by Rambabu Adapa, 2004.
Chen, Real-Time Termperature Estimation for Power MOSEFETs Conidering Thermal Aging Effects:, IEEE Trnasactions on Device and Materials Reliability, vol. 14, No. 1, Mar. 2014.
Jingquan Chen et al.: "Buck-boost PWM converters having two independently controlled switches", 32nd Annual IEEE Power Electronics Specialists Conference. PESC 2001. Conference Proceedings, Vancouver, Canada, Jun. 17-21, 2001; [Annual Power Electronics Specialists Conference], New York, NY: IEEE, US, vol. 2, Jun. 17, 2001 (Jun. 17, 2001), pp. 736-741, XP010559317, DOI: 10.1109/PESC.2001.954206, ISBN 978-0-7803-7067-8 paragraph [SectionII]; figure 3.
Cheng K W E et al.: "Constant Frequency, Two-Stage Quasiresonant Convertor", IEE Proceedings B. Electrical Power Applications, 1271980 1, vol. 139, No. 3, May 1, 1992 (May 1, 1992), pp. 227-237, XP000292493, the whole document.
Petition for Post Grant Review of U.S. Pat. No. 10,735,105 [Public], filed Feb. 16, 2021, PGR 2021-00055.
Petition for Post Grant Review of U.S. Pat. No. 10,735,105 [Public], filed Feb. 16, 2021, PGR 2021-00056.
Eaves, S. S., "Network Remote Powering Using Packet Energy Transfer, Proceedings of IEEE International Conference on Telecommunications Energy (INTELEC) 2012, Scottsdale, AZ, Sep. 30-Oct. 4, 2012 (IEEE 2012) (" EavesIEEE').
Edelstein S., Updated 2016 Tesla Model S also gets new 75-kWhbattery option, (Jun. 19, 2016), archived Jun. 19, 2016 by Internet Archive Wayback machine at https://web.archive.org/web/20160619001148/https://www.greencarreports.com/news/1103 782_updated-2016-tesla-model-s-also-gets-new-7 5-kwh-battery-option ("Edelstein").
NFPA 70 National Electrical Code, 2017 Edition (NEC).
International Standard IEC 62368-1 Edition 2.0 (2014), ISBN 978-2-8322-1405-3 ("IEC-62368").
International Standard IEC/TS 60479-1 Edition 4.0 (2005), ISBN 2-8318-8096-3 ("IEC-60479").
International Standard IEC 60950-1 Edition 2.2 (2013), ISBN 978-2-8322-0820-5 ("IEC-60950").
International Standard IEC 60947-1 Edition 5.0 (2014), ISBN 978-2-8322-1798-6 ("IEC-60947").
Tanenbaum, A. S., Computer Networks, Third Edition (1996) ("Tanenbaum").
Stallings, W., Data and Computer Communications, Fourth Edition (1994) ("Stallings").
Alexander, C. K., Fundamentals of Electric Circuits, Indian Edition (2013) ("Alexander").
Hall, S. H., High-Speed Digital System Design, A Handbook of Interconnect Theory and Design Practices (2000) ("Hall").
Sedra, A. S., Microelectronic Circuits, Seventh Edition (2014) ("Sedra").
Lathi, B. P., Modem Digital and Analog Communication Systems, Fourth Edition (2009) ("Lathi").
Understanding 802.3at PoE Plus Standard Increases Available Power (Jun. 2011) ("Microsemi").
International Search Report and Written Opinion in counterpart International Application No. PCT/US2020/020359, dated May 27, 2020, 10 pages.
International Preliminary Report on Patentability in counterpart International Application No. PCT/US2020/020359, dated Sep. 23, 2021, 9 pages.

* cited by examiner

MULTIPLE PHASE PULSE POWER IN A NETWORK COMMUNICATIONS SYSTEM

STATEMENT OF RELATED APPLICATION

The present application claims priority from U.S. Provisional Application No. 62/817,813, entitled MULTI-PHASE PULSE POWER, filed on Mar. 13, 2019. The contents of this provisional application are incorporated herein by reference in its entirety.

TECHNICAL FIELD

The present disclosure relates generally to communications networks, and more particularly, to delivery of pulse power in a communications network.

BACKGROUND

In network communications systems such as 5G cellular build-outs and connected buildings with multiple non-centralized routers on each floor, AC grid power is not always available, may not be cost effective to build out at the start or practical in some locations (e.g. wireless base stations), and in many cases cost prohibitive. Conventional PoE (Power over Ethernet) over communications cabling is limited to about 90 W (watts) based on IEEE 802.3bt and does not provide enough power for higher power communications systems.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1A:
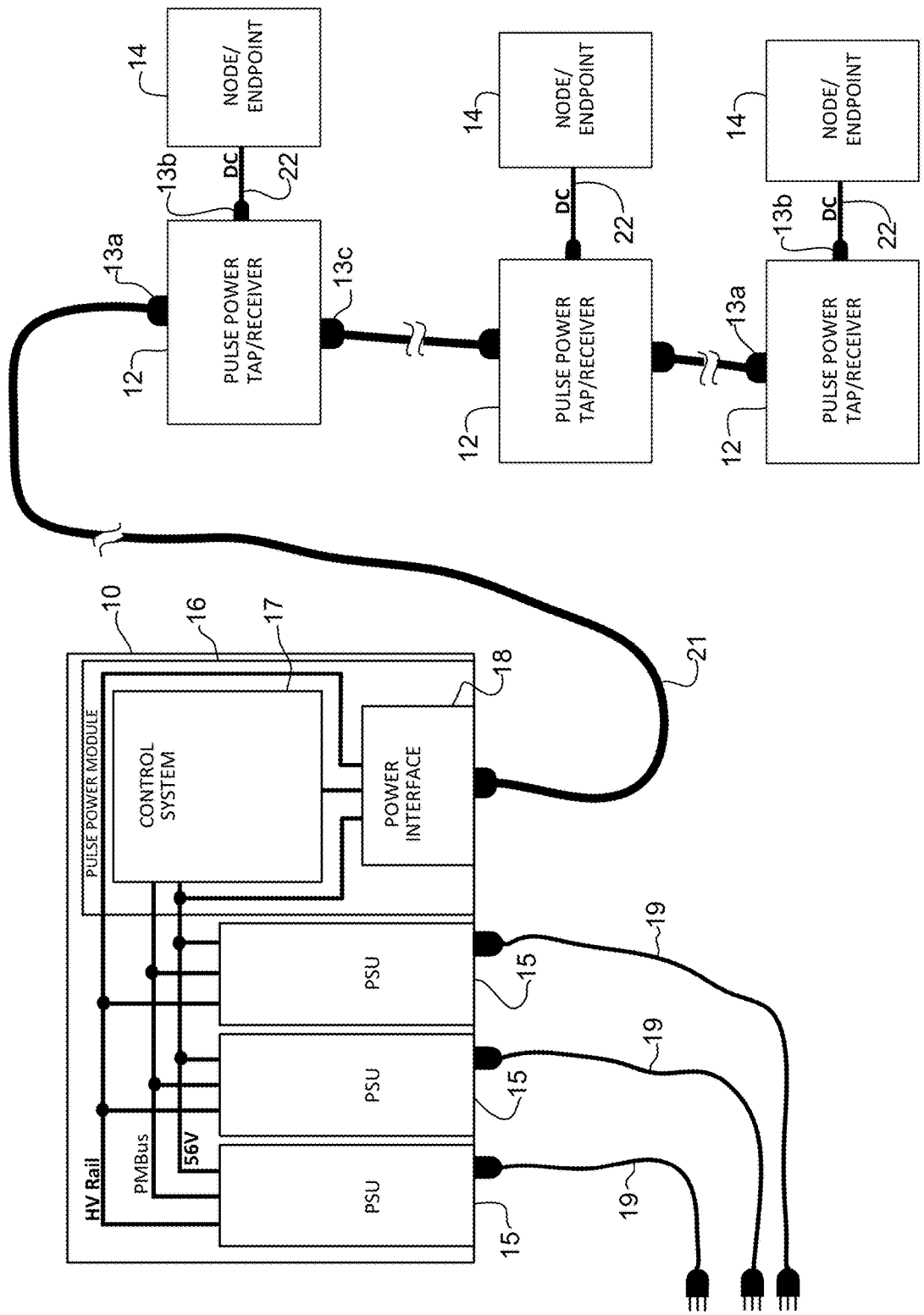
FIG. 1A is a block diagram illustrating an example of a multi-node 3-phase pulse power system, in accordance with one embodiment.

In one embodiment, an apparatus generally comprises an input power interface for receiving input power, a power control system for transmitting DC (Direct Current) pulse power on multiple phases over a cable to a plurality of powered devices and verifying cable operation during an off-time of pulses in the DC pulse power, and a cable interface for delivery of the DC pulse power on the multiple phases and data over the cable to the powered devices.

In one or more embodiments the cable comprises at least two wire pairs operating out of phase at 50% or greater duty cycle. In another embodiment, the cable comprises at least three wires for at least three phase operation and wherein continuous power is delivered to the powered devices upon loss of one of the phases. In one embodiment, each of the three wires comprises a wire pair.

In one or more embodiments, the cable further comprises a communications transmission media for bidirectional communication between the apparatus and the powered devices. In one embodiment, the communications transmission media comprises optical fibers.

In one or more embodiments, the data is transmitted over pulse power wires and provides synchronization with the powered devices.

In one or more embodiments, the power control system is operable to perform cable sensing to identify faults on the cable.

In one or more embodiments, the apparatus delivers at least 1000 Watts of power to the powered devices.

In one or more embodiments, the DC pulse power is transmitted on the cable at a voltage of at least 200 volts.

In one or more embodiments, the apparatus is configured with mid-point grounding for shock protection.

In one or more embodiments, the power control system provides continuous current and current is shared during overlap of the multiple phases.

In another embodiment, an apparatus generally comprises an input cable interface for receiving multiple phase DC pulse power and data from power sourcing equipment over a combined power and data cable, an isolation switch for fault isolation of the apparatus, and an interface for transmitting power to an endpoint node. The multiple phase DC pulse power comprises at least two phases to provide continuous DC voltage at the endpoint node and off-time of pulses in the multiple phase DC pulse power is used to verify cable operation.

In yet another embodiment, a method generally comprises receiving power at power sourcing equipment, phasing conduction of DC (Direct Current) pulse power over a plurality of wires to provide continuous DC voltage to a plurality of powered devices, transmitting multiple phase pulse power and data over a cable to the powered devices, and verifying cable operation during pulse power off-time.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

In network communications systems such as 5G cellular build-outs or other communications systems and connected buildings with multiple non-centralized routers on each floor, AC (Alternating Current) grid power is not always available, may not be cost effective to build out at the start or practical in some locations (e.g. wireless base stations), and in many cases cost prohibitive. Conventional PoE (Power over Ethernet) over communications cabling is limited to about 90 W (watts) based on IEEE 802.3bt and does not provide enough power for higher power communications systems such as remote radio heads or front haul routers as seen in cellular networks that typically need between 300 W and 1000 W to operate. Also, enterprise products that provide switching, routing, and power for access points and IP (Internet Protocol) phone systems often need about 1000 W to 1500 W of power.

There is a need for a means to deliver power to these and other devices (e.g., over 1000 W, over several 100 m (meters) to over 1000 meters) without having to add an AC outlet or other type of secondary power feed. In locations that are listed as "co-location", power is typically charged on a per connection basis, not consumed power, making each additional AC connection very expensive. AC grid power systems are often used because DC (Direct Current) power systems are not a good solution over long distances.

In order to increase available power, high voltage pulses (referred to as pulse power or pulsed power) may be used. One option is to deliver power using pulse power techniques over communications cables using a single pair of copper wires (e.g., 14 AWG (American Wire Gauge), 16 AWG twisted or semi twisted pairs, or other suitable wires). However, this approach has significant limitations due to high RMS (Root Mean Square) (effective) current in the cable and the extremely bulky filter components needed at a powered device end of the system. These limitations impact the size of end equipment and distance the power can be transmitted, making this solution unfeasible for small foot print build-outs of communications infrastructure.

A single phase pulse power system may have a difficult time meeting one or more safety requirements because there is typically a 2 ms to 4 ms off-time (off-time between power pulses) needed to properly assess environmental safety within a 10 ms window, yet still maintain reasonable power efficiency. Additional pulse power limitations include that pulse power needs off-time for safety auto-negotiation and practical cable capacitance and inductance demand low pulse repetition rates (e.g., on the order of 10 Hz (hertz) or 100 Hz). This low frequency operation results in a need for high value filter components to produce the needed DC output voltage to produce smooth DC system voltages. These inductor and capacitor filter components are physically large (bulky and costly). Long or high capacitance cables result in even lower frequency or low duty cycle operation, resulting in a need for even larger filter components. Low duty cycles need higher pulse currents and/or voltages, creating higher RMS currents and higher cable losses with lower efficiency. This also increases radiated EMI (Electromagnetic Interference)/EMC (Electromagnetic Compatibility) noise fields and emissions. Low duty cycle operation creates high power losses with high transmission line RMS current, thereby restricting transmission distance.

The embodiments described herein overcome the above limitations through the of use multiple phase (multi-phase) pulse power to achieve less loss, effectively 100% duty cycle power delivery (e.g., continuous uninterrupted power to the output with overlapping phase pulses) to a powered device, while enhancing reliability per power connection and providing safe operation over an extended length of cable to deliver high power. One or more embodiments use multiple pair cabling to place a DC pulse on each pair, timed in such a manner as to provide 100% net duty cycle continuous power at the powered device (or load). Pulse power transmissions may be through cables, transmission lines, busbars, backplanes, PCBs (Printed Circuit Boards), and power distribution systems, for example.

In one or more embodiments, single conductor pair cable is replaced with 2-phase pulse power transmission system cable with two pairs of power lines, busbars, power planes, or cable wired pairs. One or more embodiments comprise a 2-phase pulse power transmission system cable with 3-wire, busbars, power planes, or a cable wire trio. Multi-phase (three or more phase) operation may further reduce RMS current per phase and effectively provide continuous DC voltage without bulky filter components. In one or more embodiments, high or effectively 100% duty cycle to the output and split ground (e.g., mid-point high-resistance ground) may provide higher efficiency with lower RMS current cable losses, allow fast and effective phase to ground fault detection, allow for higher voltage and power to the load from limited cable voltage rating, and implement common mode systems (separate ground connection) with lower peak currents for lower EMI/EMC noise radiated and susceptible fields.

In one or more embodiments, the multiple phase approach allows for a significant off time in a 10 ms window, for example, to verify the cable for shorts, opens, unreported power loss (e.g., low current short), or human or animal added resistance. This extended off-time allows for a significant improvement in safety. The multi-phase pulse power also allows for a lower source voltage to be used to meet 100% of the powered device requirements. As previously noted, in a single phase system, the off-time needs to be filtered out with bulky filters, and even then, power efficiency/effectivity is about 80% on high loads. Use of multiple phases at a higher duty cycle and higher efficiency provides a significant component advantage and may also provide increased power delivery and reliability. For example, the loss of a single phase in a three or more phase system does not impact the 100% continuous duty cycle power effectivity at the powered device. As described below, loss of a sourced phase front end circuit may not impact operation with redundant power sources.

In one or more embodiments, PSE (Power Sourcing Equipment) may deliver>100 W to a plurality of PDs (Powered Devices) along with data (e.g., over copper wires or optical fibers) on a power and data combined cable. In one or more embodiments, the system may safely deliver 2000 W or more of power at cable lengths exceeding 1500 meters. The system may also safely deliver higher power (e.g., 6000 W) on cable lengths less than 25 meters, making it very valuable in de-centralizing large chassis systems to eliminate the back plane/large chassis system design. It is to be understood that the power levels and cable distances described herein are provided as examples and other power levels delivered over different cable lengths may be used without departing from the scope of the embodiments.

Referring now to the drawings and first to FIG. 1A, a multi-node multi-phase pulse power block diagram is shown, in accordance with one embodiment. The simplified example shown in FIG. 1A includes a PSE node 10 delivering power to three or more PDs (e.g., pulse power tap/receiver 12 and node endpoint 14). In this example the pulse power tap/receiver 12 is separate from the endpoint equipment 14, however, these nodes may be combined. Also, there may be more than one node 14 connected to one or more of the pulse power tap/receivers 12.

The PSE network device 10 comprises an input power interface (e.g., three PSUs 15 receiving power cords 19 in the example shown in FIG. 1A) for receiving input power, a power control system 17 for receiving the input power and transmitting DC pulse power on multiple phases over a cable 21 to a plurality of the powered devices 12, 14 and verifying cable operation within off-time of pulses in the DC pulse power, and a cable interface (e.g., power interface 18) for delivery of the multi-phase DC pulse power and data (e.g., control data, bidirectional communications, on copper wire or optical fiber) over the cable 21.

Figure 11:
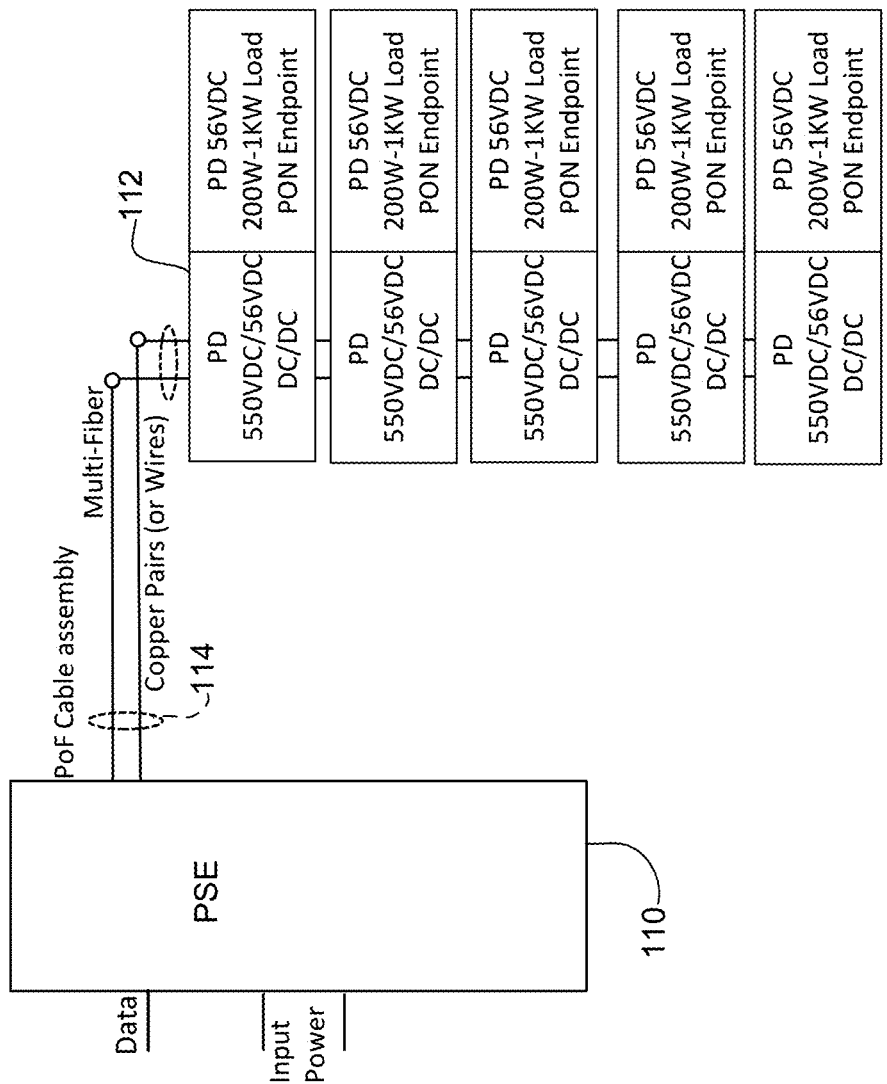
FIG. 11 illustrates an example of multi-phase pulse power and data distribution to a plurality of powered devices, in accordance with one embodiment.

The pulse power tap/receiver 12 comprises an input cable interface 13a for receiving the multiple phase DC pulse power and data from the PSE 10, an isolation switch (described below), and an interface 13b for transmitting power to the endpoint node 14. The interface 13b may be, for example, an interface connected to HVDC cable 22, pulse power cable, or a direct interface to the endpoint node (e.g., as shown in FIG. 11). The tap/receiver 12 may supply power to one or more nodes 14 along a pulse power cable system. The tap/receivers 12 may be sized to support individual node power and may implement disconnect for fault isolation or node control based on data link communications. The multiple phase (multi-phase) DC pulse power comprises at least two phases to provide continuous DC voltage at the endpoint node 14. In one or more embodiments, the multi-phase pulse power comprises at least three phases to provide continuous power in case of loss of one phase. One or more of the pulse power tap/receivers 12 also comprises an output cable interface 13c for transmitting the multiple phase DC pulse power and data on the cable to a downstream tap node 12 in a taper topology (tap node configuration).

In the example shown in FIG. 1A, the PSE 10 comprises three PSUs 15 and a pulse power module 16 comprising the control system 17 and the power interface 18. As shown in FIG. 1A, each PSU 15 may be in power communication with the pulse power module 16 over a high voltage rail, PM (Power Management) bus line, 56V line, or any combination thereof. In one example, each PSU 15 is configured for 1200 W power to provide redundancy and allow for the use of standard 15 A (amp) power cords/branch circuits. In one example, the PSE 10 is operable to deliver>1500 W total power to the nodes 14. In one example 190V line-to-ground (380V total) eliminates the need for intermediate power conversions.

The pulse power module control system 17 may provide, for example, timing and sequencing, line detection and characterization, voltage and current sensing, mid-point high resistance grounding, fault sensing, communications to PSUs, and data link/control to remote nodes. As described below, the control system 17 may verify cable operation (e.g., verify cable operational integrity) during the off-time of pulses in the DC pulse power. The pulse power module 16 may include a pulse power modulator, safety circuits, initialization circuits, PMBus, PMBus I2C (I$^2$C (Inter-Integrated Circuit)), logic, FPGA (Field-Programmable Gate Array), DSP (Digital Signal Processor), or any combination of these or other components configured to perform the functions described herein.

As shown in the example of FIG. 1A, the PSUs 15 receive AC power on cables 19 and deliver pulse power on cable 21. In one or more embodiments, the pulse power tap/receiver 12 may combine the phases and deliver high voltage (HV) DC power to the node/endpoint 14 on cable 22. In another embodiment, the pulse power tap/receiver 12 may deliver pulse power to the endpoint 14 on the cable 22. In one or more embodiments, the pulse power cable 21 includes two or more optical fibers for delivering data in the combined power and data cable, as described below. In one example, there may be a dedicated fiber (or fibers) per branch.

The wires within cable 21 may comprise two conductor, twisted pair (with or without shielding), coaxial or triaxial cable, depending on EMC considerations. A separate ground conductor may be provided to address potential common-mode noise issues. It is to be understood that the term wire as used herein may refer to a single wire or a pair of wires. As described below, the power system may comprise any number of wires, which may be bundled with fiber or other communications transmission media.

Power is supplied to the endpoint 14 through the pulse power tap/receiver 12 (also referred to as a branch tap, smart branch tap, receiver/converter). In one or more embodiments, the smart branch taps 12 allow branch fault isolation. The tap/receiver 12 may include, for example, an isolation switch (disconnect switch), data link, and logic/timing controller. The tap/receiver 12 may be used for initializing an auto-negotiation process, fault branch isolation algorithm, power initialization, and faulty PD replacements. The data link over the pulse power wires allows for implementation of the smart branch taps 12 for each node 14 and independent control (disconnect) of each branch for fault isolation or node management.

Each of the endpoints 14 may include an HVDC PSU for powering equipment at the endpoint. The endpoint 14 may comprise, for example, a 56 VDC load and may operate, for example, as a PON (Passive Optical Network) endpoint, 5G node, access point, router, switch, or other type of equipment. The endpoint 14 may also power one or more other nodes (e.g., PoE node, IoT (Internet of Things) device).

Figure 1B:
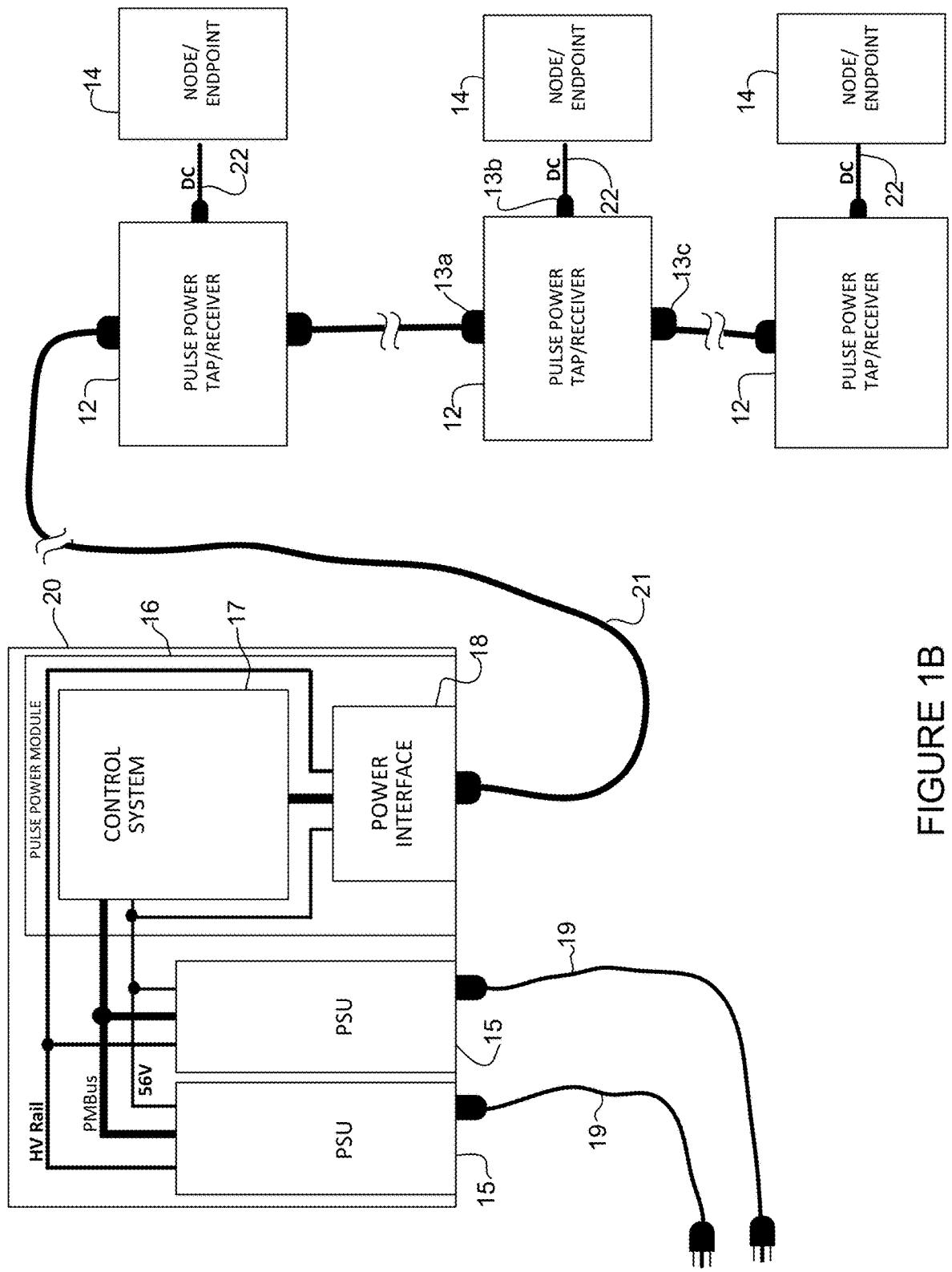
FIG. 1B is a block diagram illustrating an example of a multi-node 2-phase pulse power system, in accordance with one embodiment.

FIG. 1B illustrates a multi-node pulse power block diagram with a PSE 20 comprising two PSUs 15 for providing 2-phase pulse power. It is to be understood that the network topologies and nodes shown in FIGS. 1A and 1B are only examples and that the network may comprise different topologies and network devices without departing from the scope of the embodiments.

As previously described, the multiple PSUs allow for multi-phase operation and may also provide redundancy. For example, if one phase is lost in a system comprising three or more phases, continuous power may still be delivered to the PD nodes 14. Each phase is preferably sized to supply higher peak power to maintain full power to the PD nodes 14. Further redundancy may be provided by utilizing N+1 Front End Power (FEP) supplies. For example, in the case of a 1500 W total PD power system, three 1200 W FEPs can power the system with full redundancy of N+N or N+1, with each FEP needing only a common 120V, 15 A feed.

Figure 2A:
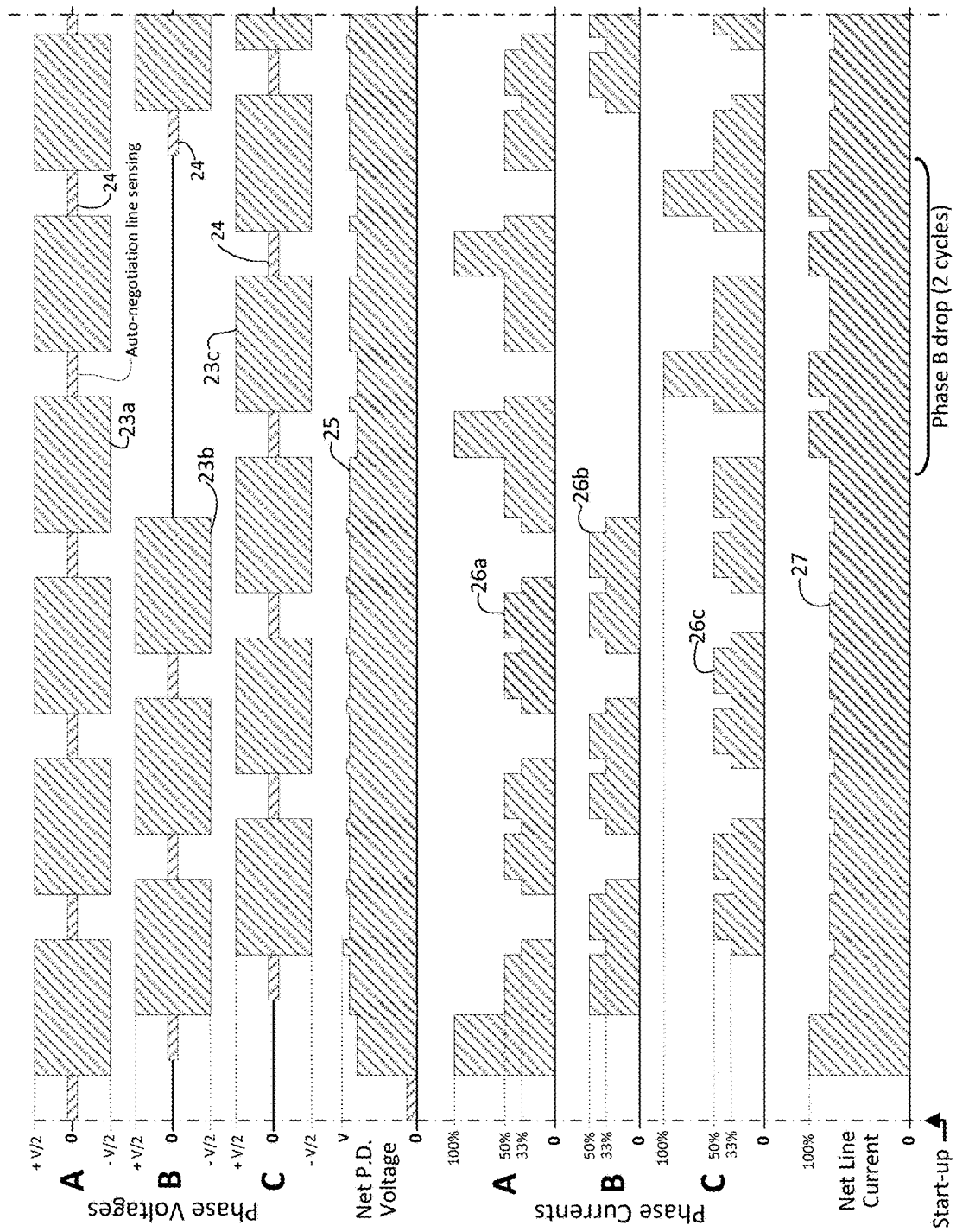
FIG. 2A illustrates an example of 3-phase pulse power voltage and current for the system shown in FIG. 1A with constant power loading from endpoint nodes.

FIG. 2A illustrates an example of 3-phase pulse power voltage and current with a 75% duty cycle with phase drop delivered in the system shown in FIG. 1A, for example. Idealized waveforms are shown and net PD voltage and line current include line loss effect with constant power loading from the nodes/endpoints 14. In the example shown in FIG. 2A, phase B drops out for two cycles. The three phase voltages (A, B, and C) (23a, 23b, 23c) are shown with auto-negotiation line sensing 24.

As shown in FIG. 2A, during pulse on-time high voltage power is delivered from the PSE to the PDs and during pulse off-time while the high voltage power is off, a low voltage may be applied on each phase for use in low voltage sensing (indicated at 24) to check wire integrity.

The net PD voltage is shown combined for the three phase voltages at 25. The corresponding phase currents (A, B, C) (26a, 26b, 26c) are shown below the voltages. The net line current corresponding to the three phase currents is shown at 27. As shown in FIG. 2A, if one phase is lost (as shown at phase B drop), continuous power is still delivered to the PD nodes. Each phase may be sized to supply higher peak power to maintain full power to the PDs.

Figure 2B:
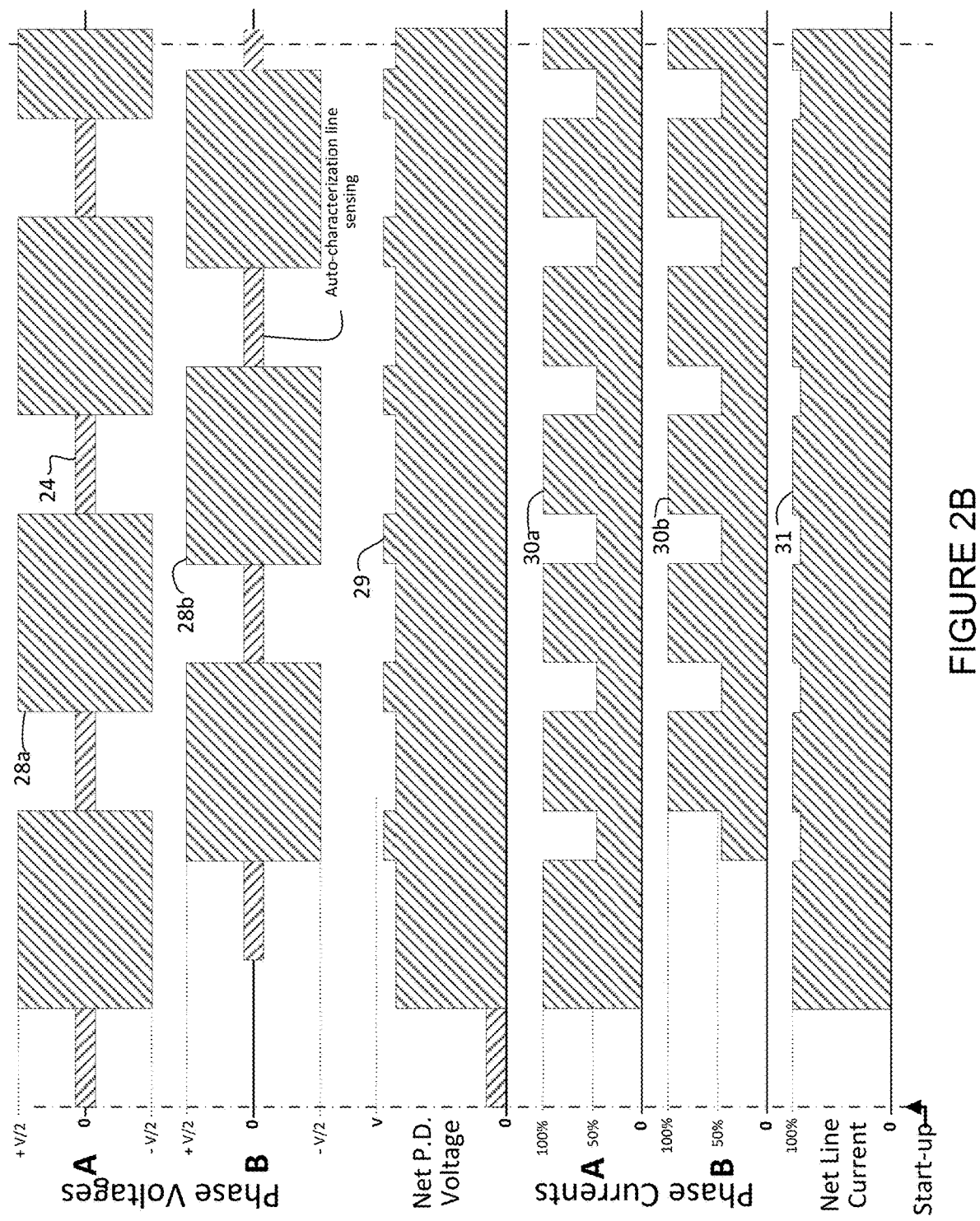
FIG. 2B illustrates an example of 2-phase pulse power voltage and current for the system shown in FIG. 1B with constant power loading from endpoint nodes.

FIG. 2B illustrates an example of 2-phase pulse power voltage and current with a 66% duty cycle delivered in the system shown in FIG. 1B, for example. Idealized waveforms are shown and net PD voltage and line current include line loss effect with constant power loading from the nodes/endpoints 14. The two phase voltages (A, B) (28a, 28b) are shown with auto-negotiation line sensing 24. The net PD voltage is shown combined for the two phase voltages at 29. The corresponding phase currents (A, B) (30a, 30b) are shown below the voltages. The net line current corresponding to the two phase currents is shown at 31.

As shown in FIGS. 2A and 2B, two or more transmission wires (e.g., wires or wire pairs) enable phasing of the conduction on each wire (e.g., wire or pair) so that at least one wire is ON at any time. When OR'd at the PD, the result is continuous DC voltage as shown at 25 and 29, thereby eliminating the need for bulky filter components. During phase overlap in the multi-phase systems, the total cable current is shared across all ON wires. Individual transmission wire current is proportionally reduced, lowering total transmission cable losses.

The off-time of the pulses may configured based on cable pair capacitance and maximum pulse power on-time may be designed to be below limits set by body shock current and standards (e.g., as referenced in UL (Underwriters Laboratories) standards 62368 and 60950 or NFPA (National Fire Protection Association) NEC (National Electrical Code) 70 chapter 7, chapter 8, and tables 11A and 11B in chapter 9, IEC/TR 60479-5, IEC-60947-1, and IEC-60947-2, or any other appropriate standard or requirement). In one or more embodiments, on-time and off-time pulse widths may be set dynamically in response to changing cable characteristics. The need for continuous net current supply to the PD may determine the phase relationship of pulses on multiple transmission pair systems.

In one or more embodiments, the off-time may be fixed, based on worst case cable length and characteristics or actively controlled based on detected cable characterization (for higher efficiency/longer range). The on-time (power delivery) for each phase may be fixed based on total pulse power voltage and shock hazard limits based on appropriate body resistance data. This approach may be used to achieve maximum pulse overlap, thereby reducing cable RMS current and maximizing power transmission distance (or minimizing conductor wire size).

As previously noted, idealized waveforms are shown in FIGS. 2A and 2B. Inductance in the PSE 10, cable 21, and PD receiver 12 may create some averaging of cable currents, raising overlap currents and lowering current during pulse off-time (FIG. 1). This effect may vary with cable length and type (inductance). Phase currents shown in FIGS. 2A and 2B do not show this effect.

It is to be understood that the currents, voltages, pulse widths, duty cycles, and phase overlaps shown in FIGS. 2A and 2B and described above are only examples and may be different than shown or described herein. For example, there may be a higher pulse current during overlap and lower current during non-overlap. The differences may be dependent on pulse power transmission inductance and capacitance (e.g., length of run or type of cable), for example. Also, the safety standards and requirements described herein are only examples and the system may be designed to meet other safety standards, requirements, or limits.

As previously noted, the multi-phase pulse power system may comprise two or more wires or wire pairs. FIGS. 3, 5, 7A and 8A show examples of multi-phase circuits comprising two wire pairs, three wires, three wire pairs, and four wire pairs, respectively. It is to be understood that these are only examples and the multi-phase system described herein may be implemented on systems comprising a different number of wires or wire pairs, without departing from the scope of the embodiments. Also, as previously described, the cable may include any number of optical fibers or additional copper wires for data transmission.

Figure 3:
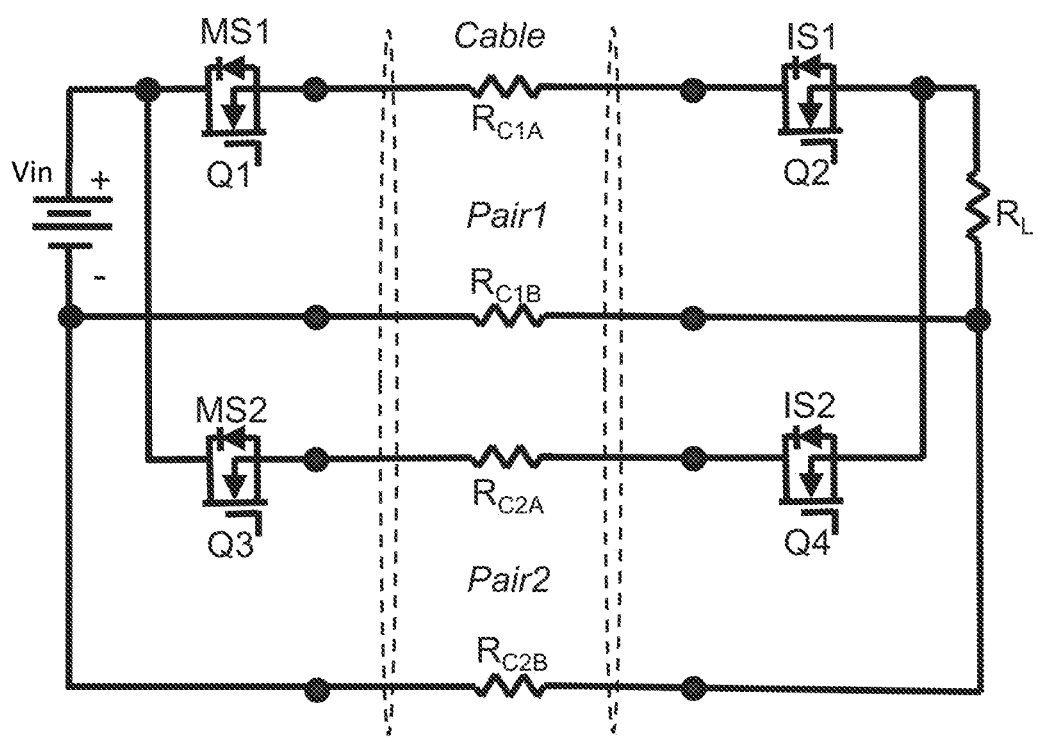
FIG. 3 illustrates an example of a circuit with a 2-phase, 2-pair cable for delivery of multi-phase pulse power, in accordance with one embodiment.

FIG. 3 shows an example of a 2-phase 2-pair cable. The simplified circuit shown in FIG. 3 comprises two modulator switches (MS1 (Q1), and MS2 (Q3)) and two isolation switches (IS1 (Q2) and IS2 (Q4)). As described below with respect to FIG. 10, the modulation switches are located at the PSE along with the voltage input (Vin), and the isolation switches are at the PD. In this example, the cable includes two wire pairs (Pair 1, Pair 2), with each pair having resistance ($R_{C1A}$, $R_{C1B}$ at Pair 1, $R_{C2A}$, $R_{C2B}$ at Pair 2). $R_L$ represents the load at the PD. The switches Q1, Q2, Q3, and Q4 may comprise any suitable actively controlled switching device capable of operating at the desired switching frequency, such as a Metal Oxide semiconductor Field Effect Transistor (MOSFET), a Bipolar Junction Transistor (BJT), a Gallium Nitride Field Effect Transistor (GaNFET), or a solid state relay (SSR). Closing and opening of the switch may be managed by control logic coupled to the switch (not shown). The control logic may be part of a processor or a separate integrated circuit.

Figure 4A:
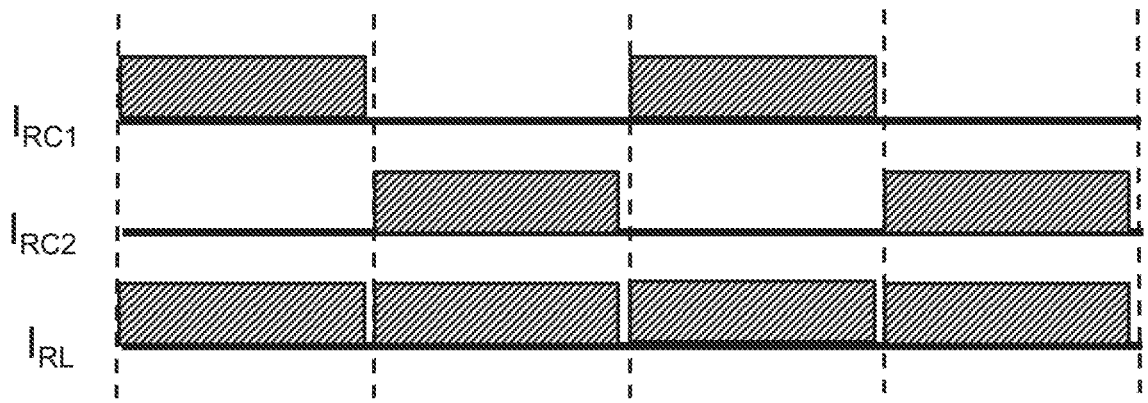
FIG. 4A illustrates a pulse current with phase shifted pulse duty cycle and discontinuous current for the circuit shown in FIG. 3.
Figure 4B:
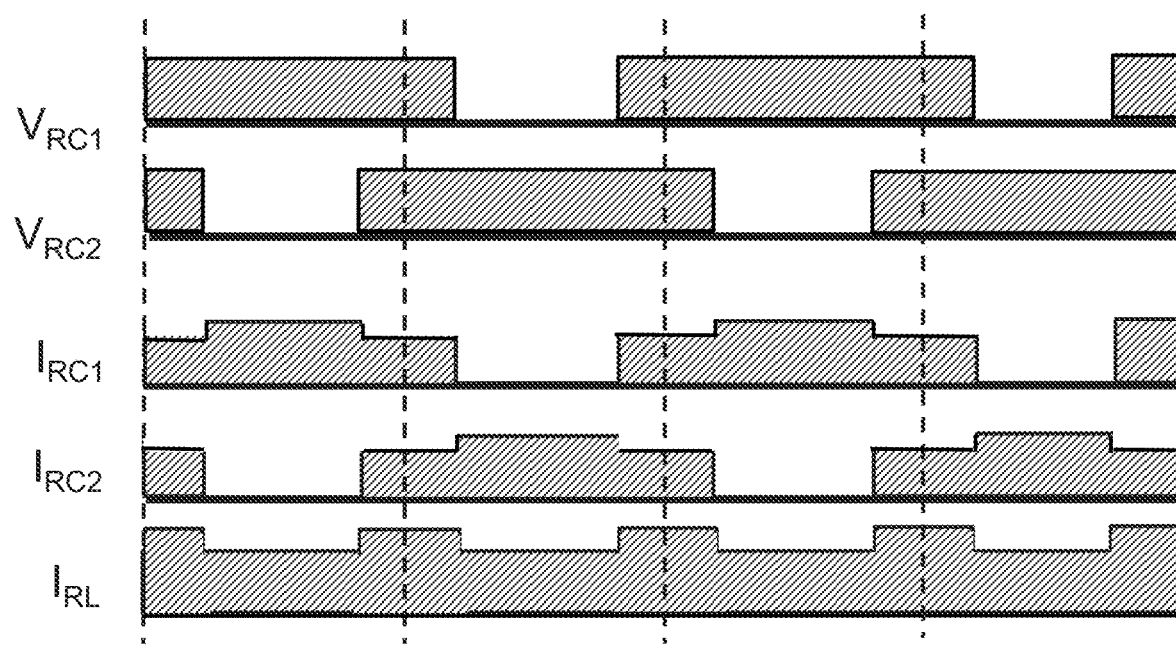
FIG. 4B illustrates a pulse current with phase shifted pulse duty cycle and continuous current for the circuit shown in FIG. 3.

FIG. 4A illustrates pulse current with phase shifted pulse duty cycle, which allows smooth DC output with minimal filtering. The example shown in FIG. 4A uses a discontinuous current. FIG. 4B illustrates pulse current with >50% pulse duty cycle per phase, which provides smooth DC output with no filter. A simplified design example of long off-time for auto-negotiation is shown in FIGS. 4A and 4B. FIGS. 4A and 4B both show current $I_{RC1}$ and $I_{RC2}$ at resistors $R_{C1A}/R_{C1B}$ and $R_{C2A}/R_{C2B}$, respectively, in FIG. 3. Current $I_{RL}$ shows the net line current at $R_L$ in FIG. 3. FIG. 4B also shows voltage $V_{RC1}$ and $V_{RC2}$ at resistors $R_{C1A}/R_{C1B}$ and $R_{C2A}/R_{C2B}$, respectively, in FIG. 3.

Figure 5:
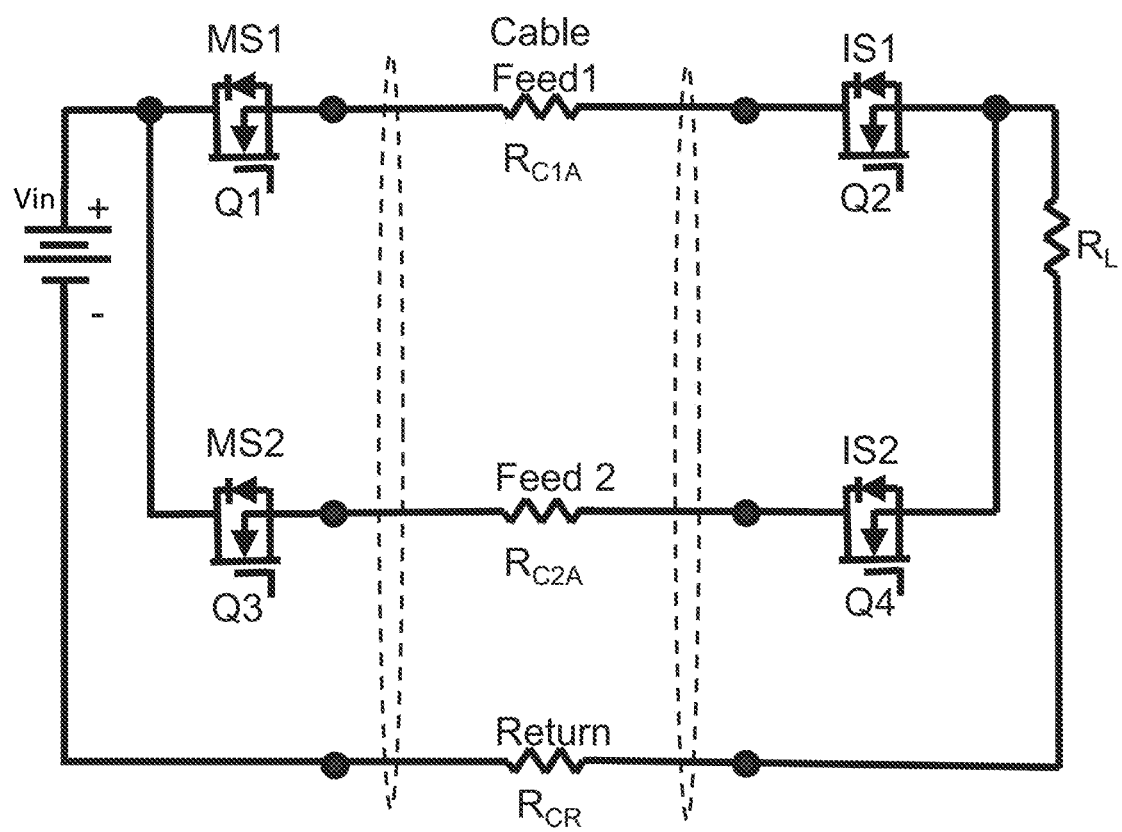
FIG. 5 illustrates an example of a circuit with a 2-phase, 3-wire cable for delivery of multi-phase pulse power, in accordance with one embodiment.

FIG. 5 illustrates a 2-phase 3-wire cable, in accordance with one embodiment. The cable includes resistance $R_{C1A}$, $R_{C2A}$, and $R_{CR}$ in Feed 1, Feed 2, and Return wires, respectively. Each feed line includes a modular switch (MS1 (Q1), MS2 (Q3)) and isolation switch (IS1 (Q2), IS2 (Q4)), as previously described with respect to the wire pairs FIG. 3. The PSE includes input voltage Vin and $R_L$ represents the load at the PD.

Figure 6A:
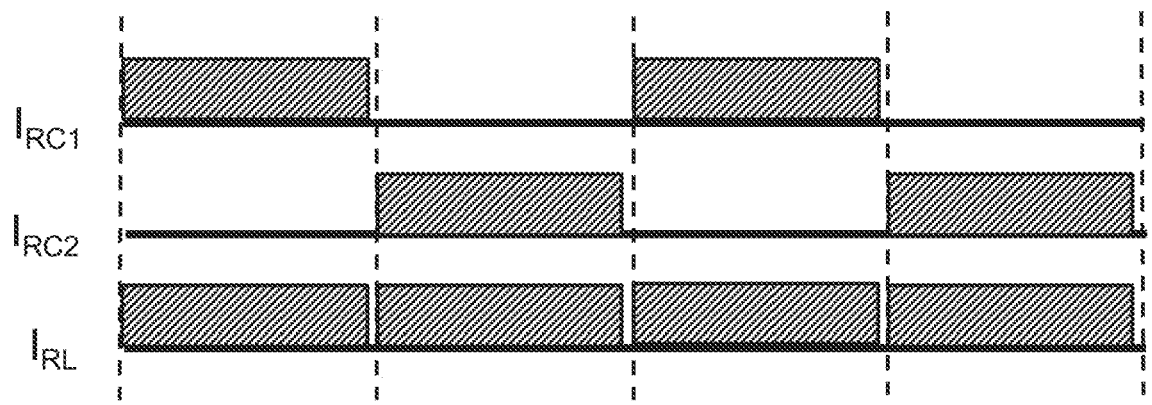
FIG. 6A illustrates a pulse current with phase shifted duty cycle and discontinuous current for the circuit shown in FIG. 5.
Figure 6B:
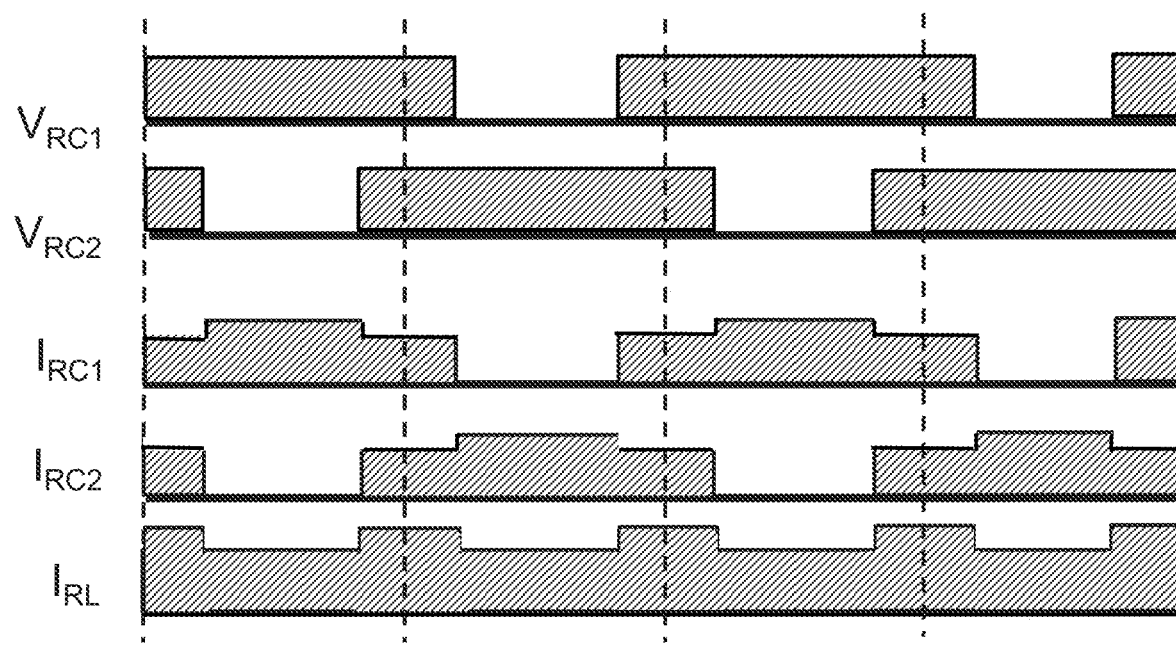
FIG. 6B illustrates pulse voltage and current with phase shifted duty cycle and continuous current for the circuit shown in FIG. 5.

FIGS. 6A and 6B illustrate a simplified design example of long off-time for auto-negotiation in the circuit of FIG. 5. FIG. 6A shows discontinuous pulse current with phase shifted pulse duty cycle, which allows smooth DC output with minimal filter. FIG. 6B shows continuous pulse current with >50% duty cycle. Current $I_{RL}$ at the load is continuous and filtering is reduced or eliminated with the continuous current. FIGS. 6A and 6B both show current $I_{RC1}$ and $I_{RC2}$ at resistors $R_{C1A}/R_{C1B}$ and $R_{C2A}/R_{C2B}$, respectively, in FIG. 5. Current $I_{RL}$, shows the net line current at $R_L$ in FIG. 5. FIG. 6B also shows voltage $V_{RC1}$ and $V_{RC2}$ at resistors $R_{C1A}/R_{C1B}$ and $R_{C2A}/R_{C2B}$, respectively, in FIG. 5.

Figure 7A:
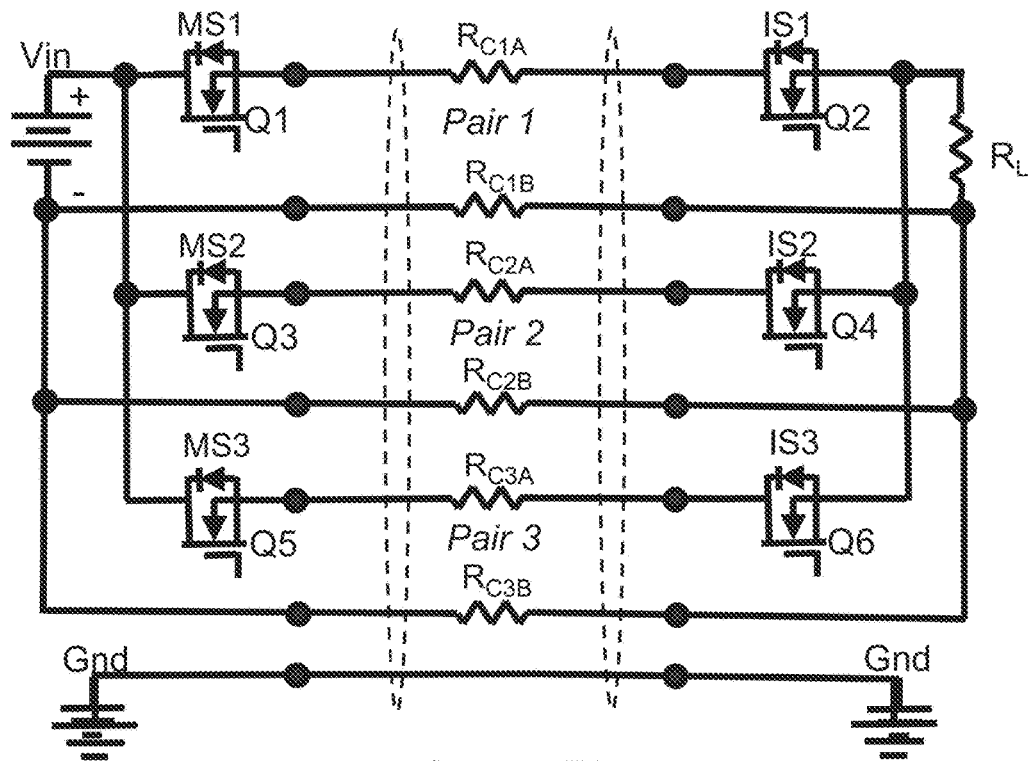
FIG. 7A illustrates an example of a circuit with a 3-phase, 3-pair cable for delivery of multi-phase pulse power, in accordance with one embodiment.

FIG. 7A illustrates an example circuit for a 3-phase, 3-pair system. The cable includes three wire pairs (Pair 1, Pair 2, Pair 3) and ground (Gnd). Each pair includes resistance ($R_{C1A}$, $R_{C1B}$ at Pair 1, $R_{C2A}$, $R_{C2B}$ at Pair 2, $R_{C3A}$, $R_{C3B}$ at Pair 3). Input voltage Vin at the PSE is shown and $R_L$ represents the load at the PD. The circuit includes three modulator switches (MS1 (Q1), MS2 (Q3), and MS3 (Q5)) and three isolation switches (IS1 (Q2), IS2 (Q4), and IS3 (Q6)). The separate ground wire (Gnd) or shield may be included for EMC control.

Figure 7B:
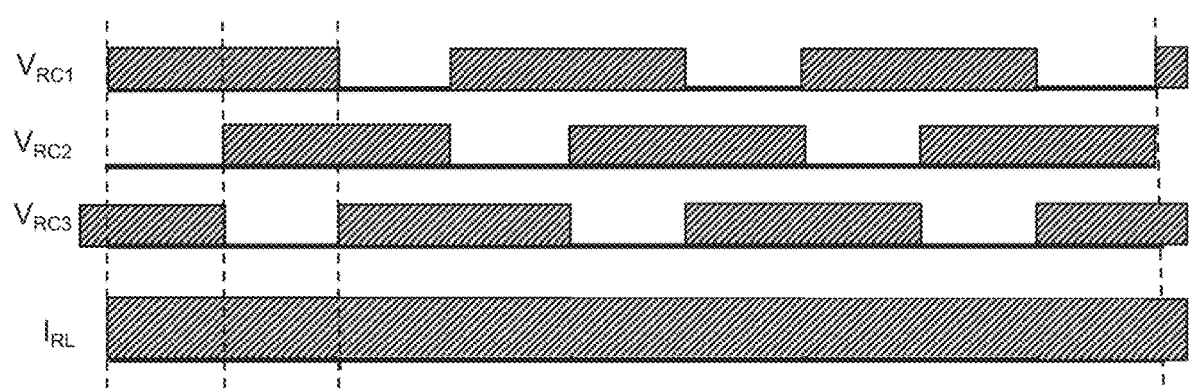
FIG. 7B illustrates pulse voltage and current with a 67% load duty cycle and continuous current for the circuit shown in FIG. 7A.

FIG. 7B illustrates a simplified design example of long off-time for auto-negotiation in the circuit of FIG. 7A with continuous current. A pulse current with 67% load duty cycle is shown in the example of FIG. 7B. Current $I_{RL}$ is continuous and filtering is reduced or eliminated. Any single phase may be lost with minimal effect on continuous DC output, as previously described with respect to FIG. 2A.

Figure 8A:
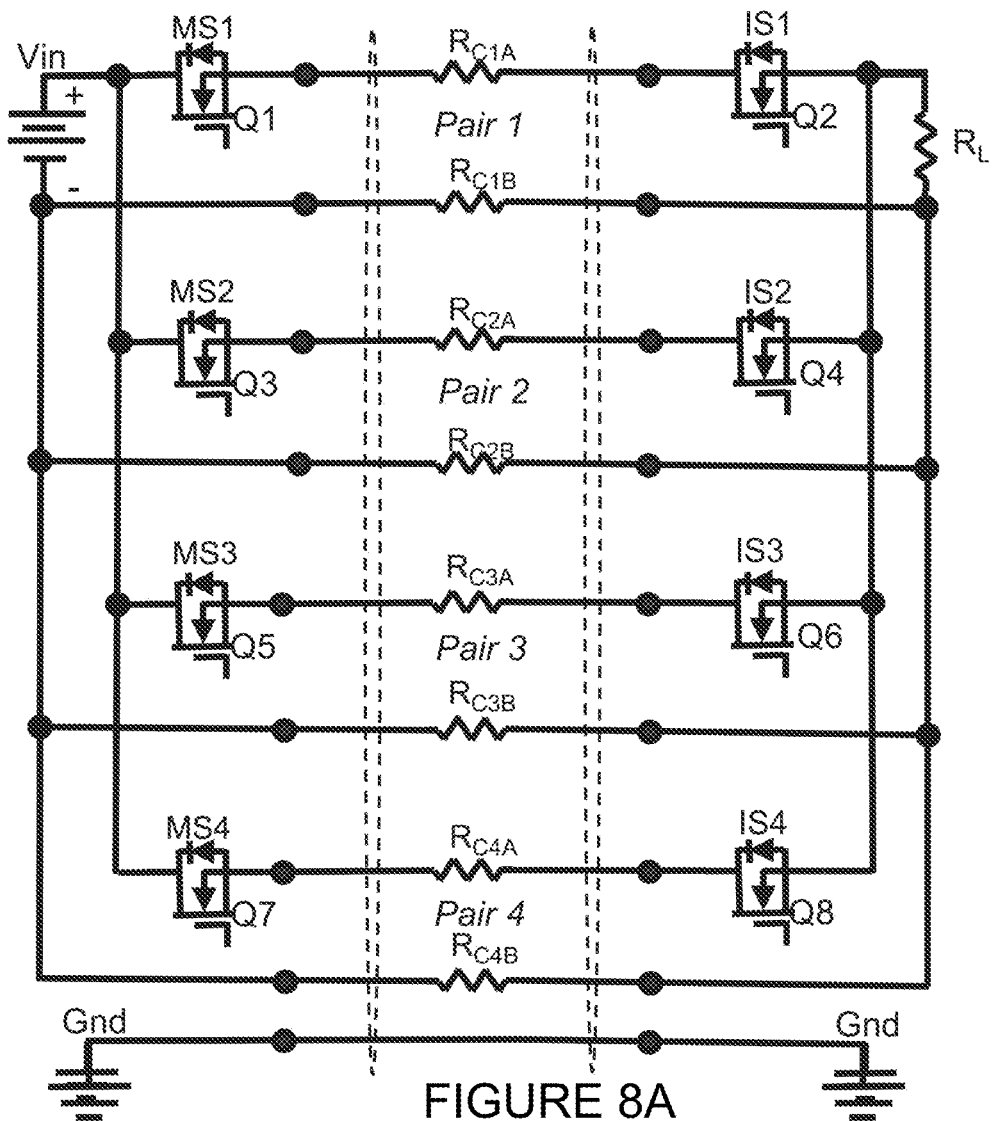
FIG. 8A illustrates an example of a circuit with a 4-phase, 4-pair cable for delivery of multi-phase pulse power, in accordance with one embodiment.

FIG. 8A illustrates an example circuit for a 4-phase, 4-pair system. The cable includes four wire pairs (Pair 1, Pair 2, Pair 3, Pair 4) and ground (Gnd). Each pair includes resistance ($R_{C1A}$, $R_{C1B}$ at Pair 1, $R_{C2A}$, $R_{C2B}$ at Pair 2, $R_{C3A}$, $R_{C3B}$ at Pair 3, $R_{C4A}$, $R_{C4B}$ at Pair 4). Input voltage Vin at the PSE is shown and $R_L$ represents the load at the PD. The circuit includes four modulator switches (MS1 (Q1), MS2 (Q3), MS3 (Q5), and MS4 (Q7)) and four isolation switches (IS1 (Q2), IS2 (Q4), IS3 (Q6), and IS4 (Q8)). The separate ground wire (Gnd) or shield may be included for EMC control. This example may be implemented in standard 4-pair cables, for example.

Figure 8B:
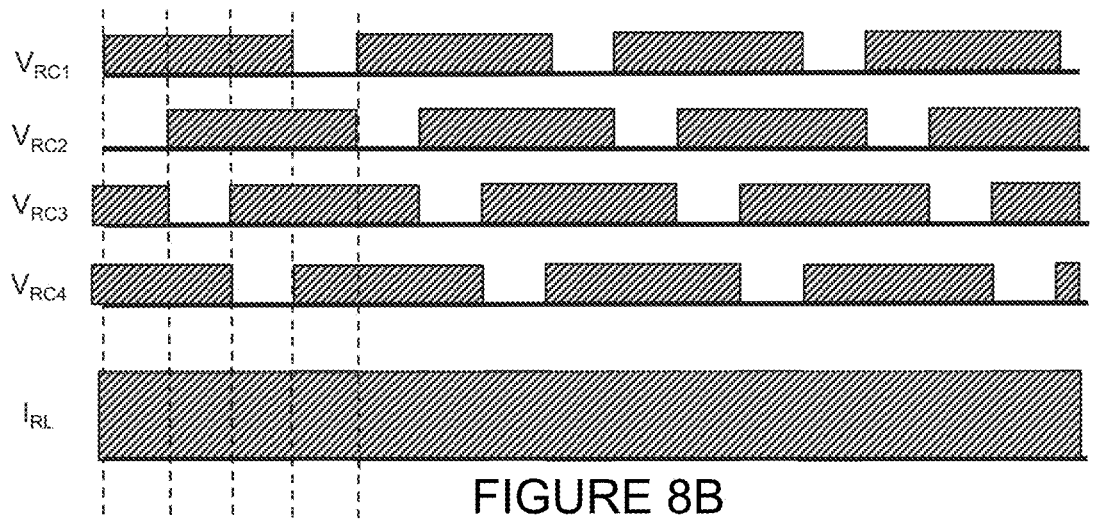
FIG. 8B illustrates pulse voltage and current with 75% duty cycle and continuous current for the circuit shown in FIG. 8A.

FIG. 8B illustrates a simplified design example of long off-time for auto-negotiation in the circuit shown in FIG. 8A with continuous current. The example shown in FIG. 8B includes a pulse current with 75% duty cycle. Current $I_{RL}$ is continuous and filtering is reduced or eliminated. RMS current per conductor is also reduced. Up to two phases may be lost with minimal effect on continuous DC output.

Figure 9:
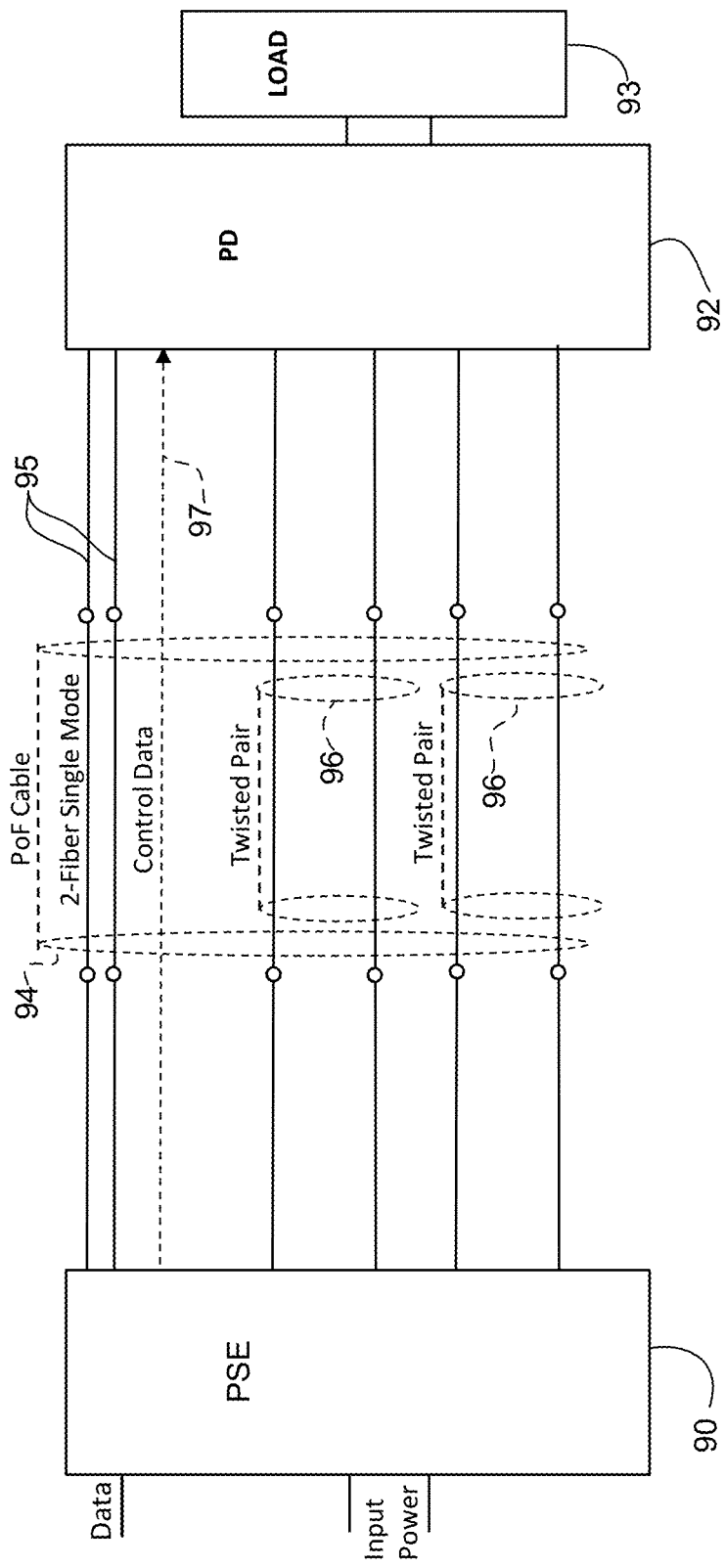
FIG. 9 is a block diagram illustrating a cable with optical fibers and two twisted wire pairs for delivery of data and multi-phase pulse power, in accordance with one embodiment.

FIG. 9 illustrates a simplified example of a data and power delivery system comprising a PSE 90 in communication with PD 92 providing power to a load 93, over a combined power and data cable (e.g., Power over Fiber (PoF) cable) 94. In this example, the cable 94 includes two optical fibers 95 (e.g., 2-fiber single mode) and two twisted pairs 96 (e.g., copper wires). Control data shown at 97 may be delivered over the optical fibers 95 or copper wires (twisted pairs) 96, or a separate transmission line. The control data may comprise, for example, isolation switch synchronization control data, bidirectional control data, or other PD synchronization data. Bidirectional communications data may also be transmitted over the optical fibers 95 or wires 96. In one example, 10 MB communications are provided over a copper pair during high voltage on pulse (e.g., on high voltage data link). Input power (e.g., AC, HVAC, HVDC, line card 48-56 VDC) may be provided at the PSE 90. As described below, the system may also be configured with one or more safety features including shock protection. In one example, the system may be configured to provide 2000 W power on copper pairs 96 over 1 km with 550 VDC pulse power. The cable may comprise any number of optical fibers and wires or wire pairs and may deliver other power levels over different lengths of cable.

Figure 10:
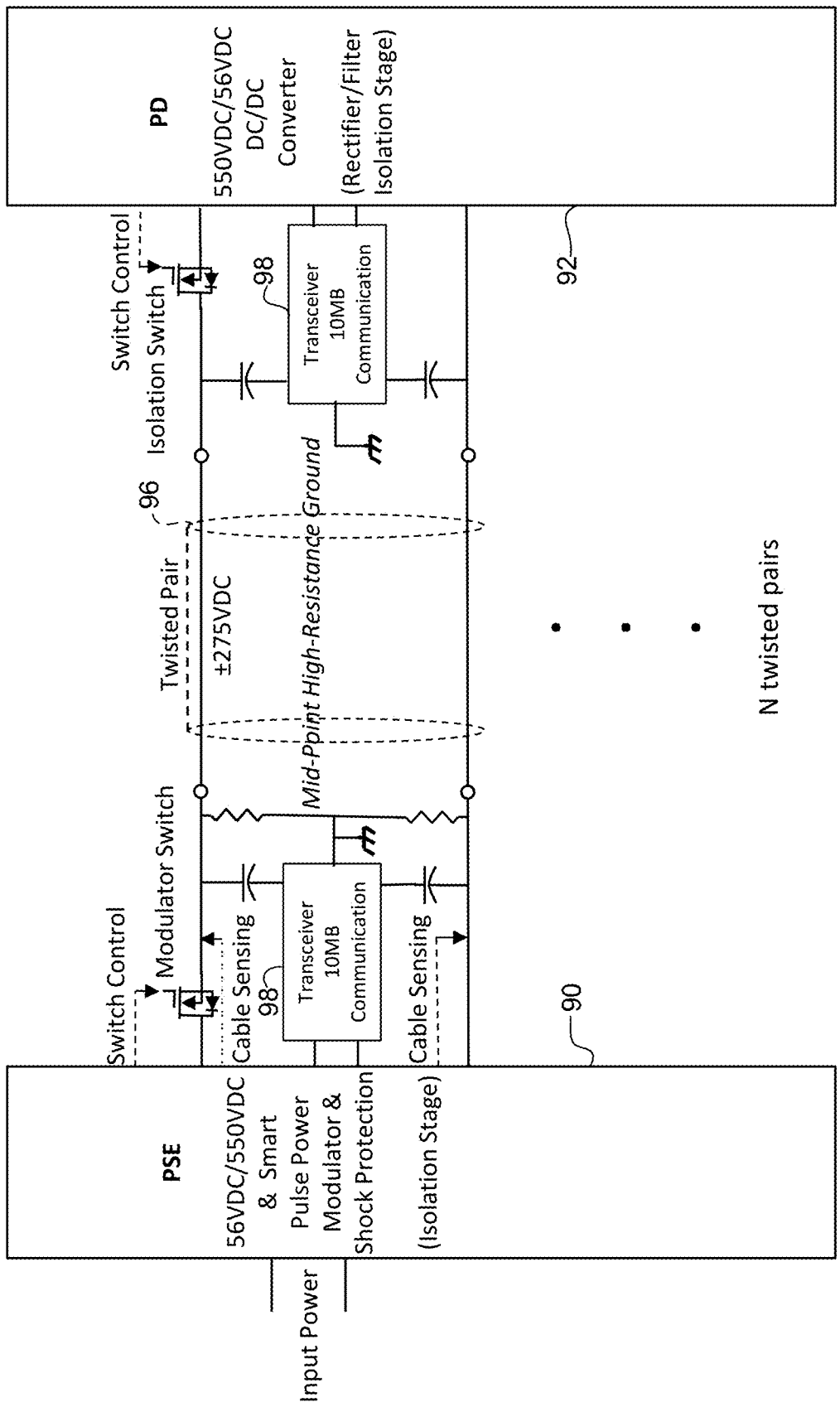
FIG. 10 illustrates details of one of the twisted pairs shown in FIG. 9, in accordance with one embodiment.

FIG. 10 illustrates additional details of one of the twisted pairs 96 shown in FIG. 9, in accordance with one embodiment. In this example, the system provides high resistance mid-point grounding for shock protection. In one example, mid-point grounding drops the line to ground voltage (e.g., 275V line-to-ground, 550V line-to-line). In one or more embodiments, both feed and return of each transmission pair is switched to implement effective control and line-to-ground fault detection is between 10-100 μs. As shown in FIG. 10, cable sensing may be provided at the PSE 90. The system may provide line-to-ground (GFI (Ground Fault Interrupters)) shock protection and line-to-line shock protection for any cable fault condition during auto-negotiation with high-voltage pulse off-time. One or more embodiments provide single point of failure and redundancy for any high-voltage path to cable. In one or more embodiments, the system may use 48-56 VDC low voltage for initial start-up conditions and default condition to establish data link and safety interlock before enabling high voltage operation. In one example, 10 MB communications are provided over the twisted pair 96 during high voltage on pulse as shown at transceiver 98.

Additional safety and fault protection may be included as described, for example, in U.S. patent application Ser. No. 15/971,729, filed May 4, 2018, entitled "High Power and Data Delivery in a Communications Network with Safety and Fault Protection", which is incorporated herein by reference in its entirety.

FIG. 11 illustrates an example of a multi-phase pulse power distribution system, in accordance with one embodiment. A PSE source 110 delivers power and data over a PoF cable assembly 114 comprising fibers and wires to a plurality of PDs 112. In one or more embodiments, the multi-phase pulse power is delivered at a voltage of at least 200 volts on the multi-phase DC pulse power cable 114. In one example, 1-2 kW of power is provided on copper pairs with data fiber pairs over 1-10 km with 550 VDC pulse power. As previously described, the pulse power may comprise any number of phases. As noted above, the system may use 56 VDC low voltage for initial start-up conditions and default condition to establish data link and safety interlock before enabling high voltage operation. 550 VDC pulse power may be distributed to multiple low power PD PON endpoint loads such as 5G radio sets, for example.

It is to be understood that the voltages and power levels shown in FIG. 11 and described herein are only examples and that other voltages or power levels may be used, as previously described. For example, the input may comprise 115 VAC, 10/13 A at 1100 W with at least two power inputs. The high voltage output may comprise, for example, 275/550/1100 VDC at 3 kW and may be adjustable (0-100%). The low voltage output may comprise, for example, 56V, 12V, 3.3V at 150 W, or any other suitable low voltage output.

Figure 12:
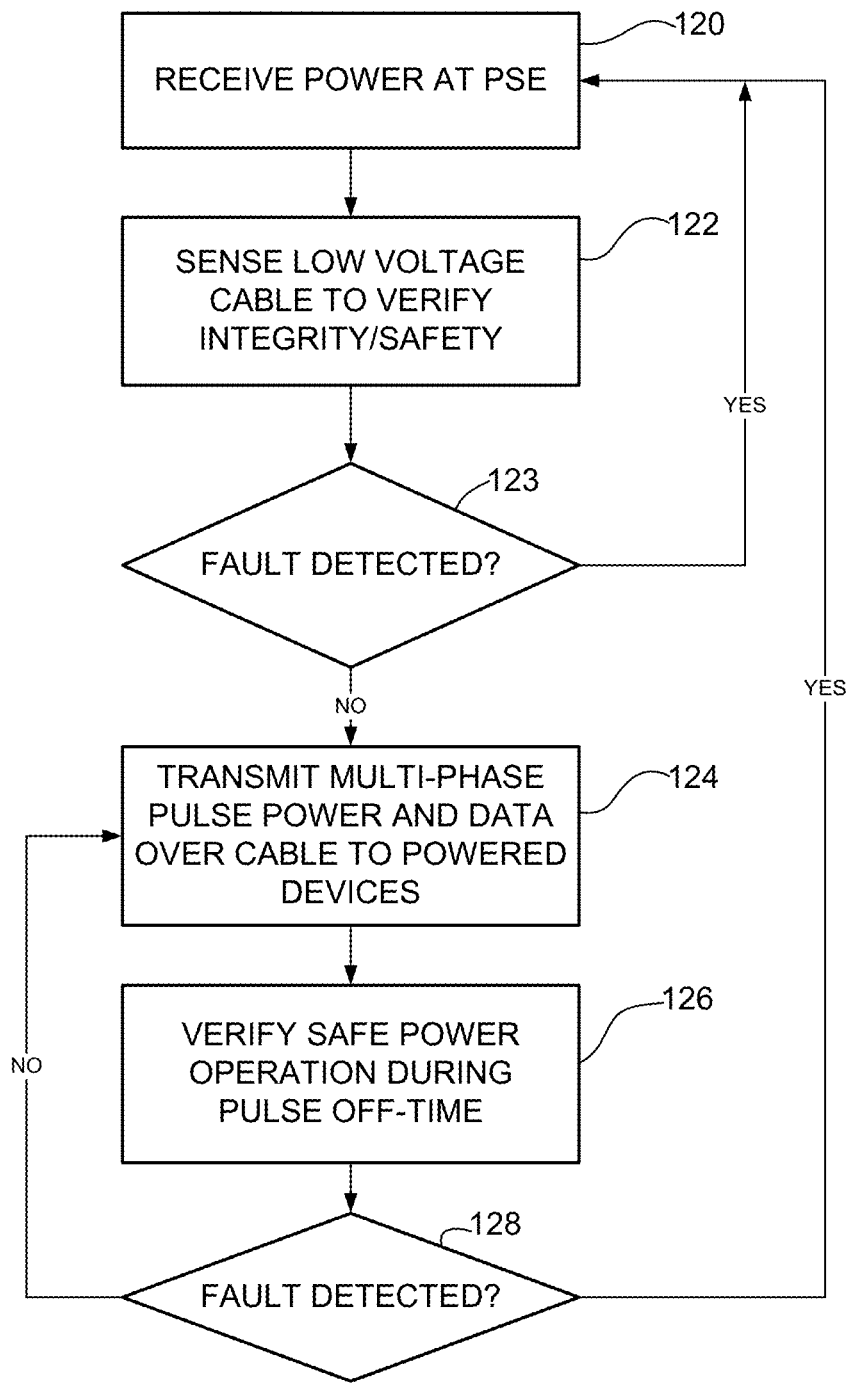
FIG. 12 is a flowchart illustrating an overview of a process for delivering multi-phase pulse power, in accordance with one embodiment.

FIG. 12 is a flowchart illustrating an overview of a process for delivering multi-phase pulse power, in accordance with one embodiment. At step 120, a power sourcing equipment network device (e.g., PSE 10 in FIG. 1) receives input power. At step 122, safe, low voltage cable sensing is performed to verify safety and integrity of the cable prior to connection to high voltage. The low voltage test may be used to characterize the cable and detect line-to-ground and line-to-line faults before connecting the high voltage. If any faults are detected during the low voltage test, high voltage power is not applied (step 123). If cable integrity is verified, the PSE 10 transmits the multi-phase pulse power and data over a combined cable to multiple powered devices (step 124). As previously described, the pulse power is delivered on two or more wires to enable phasing of the conduction so that at least one wire (wire, wire pair) is on at any time, thereby providing continuous power at the PD. The PSE verifies safe power operation during off-time of pulses for each phase (step 126). The off-time may be used to check the cable for shorts, opens, unreported power loss, or added impedance (e.g., due to human or animal contact), for example. Verification of safe power operation during pulse off-time may comprise, for example, monitoring of high voltage decay to detect cable or system faults and a low voltage test before initiating the next on-pulse. If no faults are detected (step 128), the next on-pulse may be initiated (step 124). Line-to-ground faults may be monitored continuously so that protection response is fast. Line-to-line faults may be detected during off-pulse time and protection consists of inhibiting the next on-pulse.

It is to be understood that the process shown in FIG. 12 is only an example and steps may be added, combined, removed, or modified without departing from the scope of the embodiments.

The embodiments described herein operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT), Internet, intranet, or any other network).

The network is configured to pass electrical power to network devices such as 5G nodes, switches, routers, access points, or other electronic components and devices. Signals may be exchanged among communications equipment and power transmitted from power sourcing equipment to powered devices. The network may include any number or arrangement of network communications devices (e.g., switches, access points, routers, or other devices operable to route (switch, forward) data communications).

Figure 13:
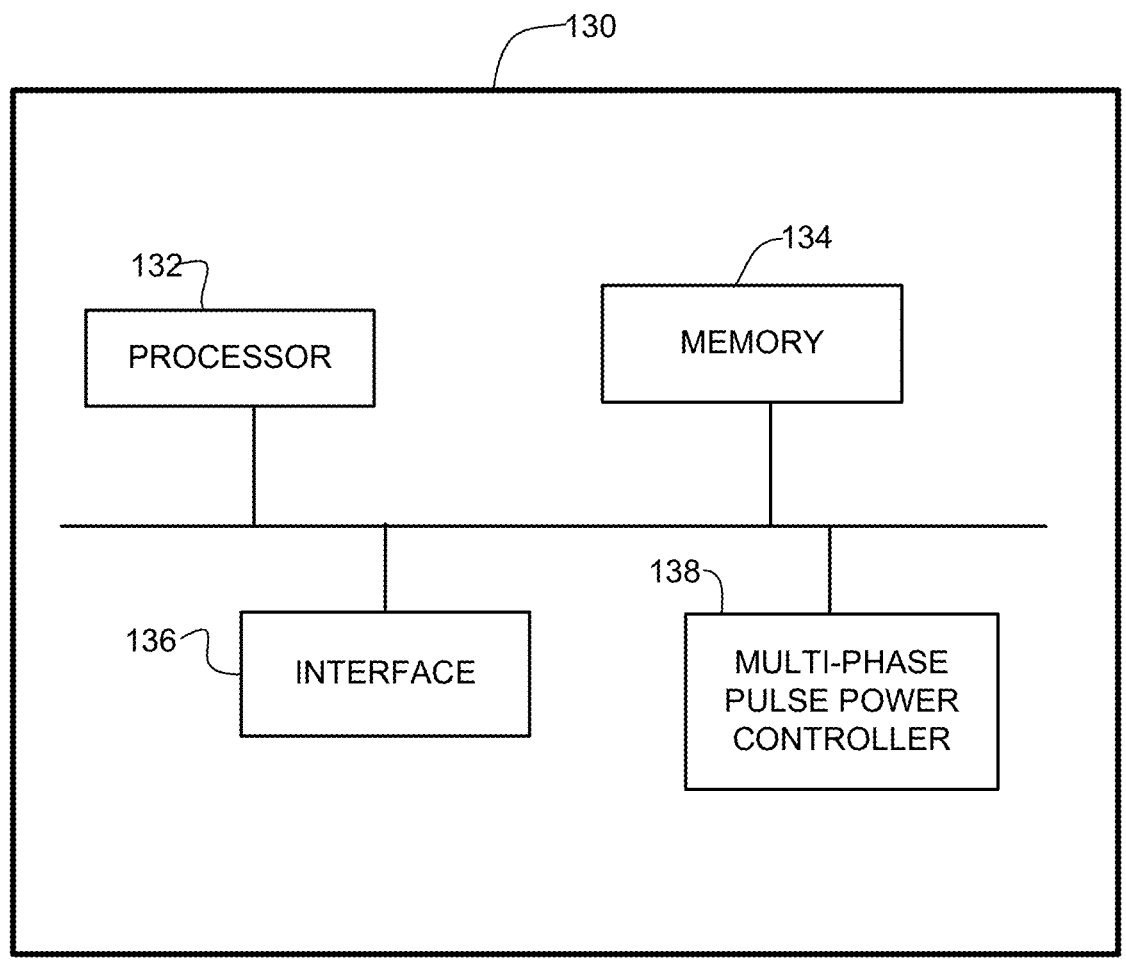
FIG. 13 is a block diagram depicting an example of a network device useful in implementing embodiments described herein.

FIG. 13 is a block diagram illustrating an example of a network device 130 (e.g., PSE, PD) that may be used to implement the embodiments described herein. In one embodiment, the network device 130 is a programmable machine that may be implemented in hardware, software, or any combination thereof. The network device 130 includes one or more processor 132, memory 134, interface 136, and multi-phase pulse power control module 138.

Memory 134 may be a volatile memory or non-volatile storage, which stores various applications, operating systems, modules, and data for execution and use by the processor 132. For example, components of the multi-phase power controller module 138 (e.g., code, logic, or firmware, etc.) may be stored in the memory 134. The network device 130 may include any number of memory components.

The network device 130 may include any number of processors 132 (e.g., single or multi-processor computing device or system), which may communicate with a forwarding engine or packet forwarder operable to process a packet or packet header. The processor 132 may receive instructions from a software application or module, which causes the processor to perform functions of one or more embodiments described herein.

Logic may be encoded in one or more tangible media for execution by the processor 132. For example, the processor 132 may execute codes stored in a computer-readable medium such as memory 134. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described above with respect to the flowchart of FIG. 12.

The interface 136 may comprise any number of power interfaces or network (data) interfaces (line cards, ports, connectors, receptacles, power interface, combined data and power cable interface) for receiving data or power, or transmitting data or power to other devices. The network interface may be configured to transmit or receive data using a variety of different communications protocols and may include mechanical, electrical, and signaling circuitry for communicating data over physical links coupled to the network. For example, line cards may include port processors and port processor controllers. The power interface may be configured for PoF, PoE, higher power PoE, enhanced PoE, PoE+, UPoE, or similar operation.

It is to be understood that the network device 130 shown in FIG. 13 and described above is only an example and that different configurations of network devices may be used. For example, the network device may further include any suitable combination of hardware, software, algorithms, processors, devices, components, or elements operable to facilitate the capabilities described herein.

As can be observed from the foregoing, one or more embodiments provide improved power delivery with enhanced reliability and safety over an extended length of cable to provide high power (e.g., 1000 W, 2000 W, 6000 W, or other power>100 W). In one example, a two phase system greatly reduces or eliminates energy storage filtering used at the PD to produce smooth DC voltage. In one example, a two phase pulse power transmission system operates out of phase at 50% or greater duty cycle to produce smooth DC voltage. In another example, a three (or greater) phase pulse power transmission system operates phase shifted at 67% or greater duty cycle to reduce individual wire currents to extend transmission distance. In one example, a three phase pulse power transmission system operates phase shifted at 67% or greater duty cycle to introduce redundancy to protect against individual wire failure. The number of phases may be further increased (maintaining phase shifting) to further reduce individual wire currents to extend transmission distance and/or add redundancy. A four phase implementation with four pairs of wires may have reduced individual pair currents and may utilize existing cable infrastructure. The pulse power design concept with multi-phase power distribution described herein allows for higher-power transmission with higher efficiency, lower EMC, and filter size/cost reduction using high voltage power transmission safely across multiple short distributed branch nodes and long distances at a low installation and operational cost with improved efficiency.

Although the method and apparatus have been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   an input power interface for receiving input power;
   a power control system for transmitting DC (Direct Current) pulse power on multiple phases over a cable to a plurality of powered devices and verifying cable operation during an off-time of pulses in said DC pulse power; and
   a cable interface for delivery of the DC pulse power on said multiple phases and data over the cable to said plurality of powered devices;
   wherein the DC pulse power comprises voltage pulses with high voltage power delivered during a pulse on-time and low voltage power delivered during the pulse off-time with auto-negotiation line sensing between the power control system and each of the powered devices, the voltage pulses offset between said multiple phases to provide continuous power; and
   wherein the power control system is operable to transmit power and verify operation of the cable and the powered devices for each of the multiple phases before transmitting the DC pulse power.

2. The apparatus of claim 1 wherein the cable comprises at least two wires operating out of phase at 50% or greater duty cycle.

3. The apparatus of claim 1 wherein the cable comprises at least three wires for at least three phase operation and wherein said continuous power is delivered to said plurality of powered devices upon loss of one of said at least three phases.

4. The apparatus of claim 3 wherein each of said at least three wires comprises a wire pair.

5. The apparatus of claim 1 wherein the cable further comprises a communications transmission media for bidirectional communications between the apparatus and said plurality of powered devices.

6. The apparatus of claim 5 wherein the communications transmission media comprises optical fibers.

7. The apparatus of claim 1 wherein the data is transmitted over pulse power wires and provides synchronization with said plurality of powered devices.

8. The apparatus of claim 1 wherein the power control system is operable to perform cable sensing to identify faults on the cable.

9. The apparatus of claim 1 wherein the apparatus delivers at least 1000 Watts of power to said plurality of powered devices.

10. The apparatus of claim 1 wherein the DC pulse power is transmitted on the cable at a voltage of at least 200 volts.

11. The apparatus of claim 1 wherein the apparatus is configured with mid-point grounding for shock protection.

12. The apparatus of claim 1 wherein the power control system provides continuous current and wherein current is shared during overlap of said multiple phases.

13. The apparatus of claim 1 wherein the DC pulse power is delivered on at least two wires to enable phasing of the pulses so that at least one wire is on at any time to provide said continuous power at the powered devices.

14. The apparatus of claim 1 wherein the power control system is configured to initialize transmission of each of the multiple phases with each of the powered devices.

15. The apparatus of claim 1 wherein said verifying cable operation comprises checking for at least one of a thermal buildup, a current disparity, or a ground fault.

16. The apparatus of claim 1 wherein the power control system is configured to interrupt the transmission of the DC pulse power on at least one of the multiple phases based on said verifying cable operation.

17. The apparatus of claim 16 wherein the power control system is configured to continuously transmit, during said interruption of the transmission of the DC pulse power on said at least one of the multiple phases, the DC pulse power on remaining phases.

18. The apparatus of claim 16 wherein the power control system is configured to adjust, during said interruption of the transmission of the DC pulse power on said at least one of the multiple phases, the DC pulse power on the remaining phases to maintain full power at the powered devices.

19. The apparatus of claim 18 wherein the DC pulse power is adjusted by adjusting current transmitted by said remaining phases.

20. The apparatus of claim 18 wherein the DC pulse power is adjusted by adjusting duty cycles of said remaining phases.

21. The apparatus of claim 1 wherein each of the multiple phases of the DC pulse power is associated with one or more data signals.

22. The apparatus of claim 1 wherein there is overlap between the pulse-on time for two or more phases of the multiple phases and wherein a higher current is transmitted during said overlap than during a period of non-overlap.

23. The apparatus of claim 1 wherein the power control system comprises a pulse power modulator and an initialization circuit for each of the multiple phases of the DC pulse power.

24. The apparatus of claim 1 wherein the pulse off-time is actively controlled by the power control system based on a detected cable characterization and the pulse on-time is fixed based on a safety factor.

25. An apparatus comprising:
an input cable interface for receiving multiple phase DC (Direct Current) pulse power and data from power sourcing equipment over a combined power and data cable;
an isolation switch for fault isolation of the apparatus; and
an interface for transmitting power to an endpoint node;
wherein the multiple phase DC pulse power comprises at least two phases to provide continuous DC voltage at the endpoint node and wherein off-time of pulses in the multiple phase DC pulse power is used to verify cable operation;
wherein each phase of the multiple phase DC pulse power comprises voltage pulses with high voltage power delivered during a pulse on-time and low voltage power delivered during the pulse off-time with auto-negotiation with the power sourcing equipment, the voltage pulses offset between multiple phases to provide continuous power; and
wherein power is received at the apparatus and fault isolation is performed at the apparatus and the isolation switch is synchronized with the power sourcing equipment before receiving the multiple phase DC pulse power.

26. The apparatus of claim 25 further comprising an output cable interface for transmitting the multiple phase DC pulse power and data to a downstream tap node.

27. The apparatus of claim 25 wherein the cable comprises a data link for control of the isolation switch.

28. The apparatus of claim 25 wherein the cable comprises at least two wires operating out of phase at 50% or greater duty cycle.

29. The apparatus of claim 25 wherein the cable comprises at least three wires for at least three phase operation and wherein continuous power is provided upon loss of one of said at least three phases.

30. The apparatus of claim 25 wherein the cable comprises a plurality of wire pairs and optical fibers.

31. A method comprising:
receiving power at power sourcing equipment;
transmitting the power to a plurality of powered devices and performing low voltage cable sensing to verify safety and integrity of a cable and the powered devices;
phasing conduction of DC (Direct Current) pulse power over a plurality of wires to provide continuous DC voltage to the powered devices;
simultaneously transmitting multiple phase pulse power and data signals associated with at least two of the multiple phases over the cable to said plurality of powered devices; and
verifying operation of the cable and the powered devices during pulse power off-time;
wherein the DC pulse power comprises voltage pulses with high voltage power delivered during a pulse on-time and low voltage power delivered during the pulse off-time with auto-negotiation line sensing between the power sourcing equipment and each of the powered devices.

32. The method of claim 31 wherein transmitting said multiple phase pulse power at said high voltage power comprises transmitting at least 1000 watts of power and transmitting said data comprises transmitting said data on optical fibers within the cable.

* * * * *